US012777680B2

(12) United States Patent
Chang et al.

(10) Patent No.: US 12,777,680 B2
(45) Date of Patent: Oct. 27, 2026

(54) ISOLATION FOR MULTIGATE DEVICES

(71) Applicant: Taiwan Semiconductor Manufacturing Company, Ltd., Hsin-Chu (TW)

(72) Inventors: Cheng-Wei Chang, Taipei City (TW); Shahaji B. More, Hsinchu City (TW); Yi-Ying Liu, Hsinchu City (TW); Shuen-Shin Liang, Hsinchu County (TW); Sung-Li Wang, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 1146 days.

(21) Appl. No.: 17/692,316

(22) Filed: Mar. 11, 2022

(65) Prior Publication Data

US 2023/0124549 A1 Apr. 20, 2023

Related U.S. Application Data

(60) Provisional application No. 63/255,485, filed on Oct. 14, 2021.

(51) Int. Cl.

*H10D 30/01* (2025.01)
*H10D 30/67* (2025.01)
(Continued)

(52) U.S. Cl.

CPC ....... *H10D 30/6735* (2025.01); *H10D 30/031* (2025.01); *H10D 30/6713* (2025.01);
(Continued)

(58) Field of Classification Search

CPC ........... H10D 30/6735; H10D 30/6757; H10D 62/115; H10D 30/6713; H10D 62/116;
(Continued)

(56) References Cited

U.S. PATENT DOCUMENTS 11,133,311 B2 * 9/2021 Bhuwalka .............. B82Y 10/00
11,508,823 B2 * 11/2022 Xie .................... H01L 21/76865
(Continued)

FOREIGN PATENT DOCUMENTS

CN 111987149 A 11/2020
TW 200721322 A 6/2007
(Continued)

*Primary Examiner* — Matthew C Landau
*Assistant Examiner* — Vincent Kipkemoi Rono
(74) *Attorney, Agent, or Firm* — HAYNES AND BOONE, LLP

(57) ABSTRACT

An exemplary method includes forming a semiconductor fin having a semiconductor layer stack over a semiconductor mesa. The semiconductor layer stack includes a first semiconductor layer, a second semiconductor layer, and the first semiconductor layer is between the semiconductor mesa and the second semiconductor layer. The method further includes forming an isolation feature adjacent the semiconductor mesa and forming a semiconductor cladding layer along a sidewall of the semiconductor layer stack. The semiconductor cladding layer extends below a top surface of the semiconductor mesa and a portion of the isolation feature is between the semiconductor cladding layer and a sidewall of the semiconductor mesa. The method further includes, in a channel region, replacing the first semiconductor layer of the semiconductor fin and the semiconductor cladding layer with a gate stack. The portion of the isolation feature is between the gate stack and the sidewall of the semiconductor mesa.

20 Claims, 23 Drawing Sheets

(51) Int. Cl.
*H10D 84/01* (2026.01)
*H10D 84/03* (2025.01)

(52) U.S. Cl.
CPC ..... *H10D 30/6755* (2025.01); *H10D 30/6757* (2025.01); *H10D 84/0128* (2025.01); *H10D 84/013* (2025.01); *H10D 84/0151* (2025.01); *H10D 84/038* (2025.01)

(58) Field of Classification Search
CPC ............ H10D 84/0151; H10D 84/0188; H01L 21/762–764; H01L 29/7869; H01L 29/78696; H01L 29/0847; H01L 29/165; H01L 29/41766; H01L 29/7848; H01L 21/823878; H01L 27/088; H01L 27/092; H01L 29/0673; H01L 29/66439; H01L 29/66545; H01L 29/775; H01L 21/823437; H01L 21/823814; B82Y 10/00
See application file for complete search history.

(56) References Cited

U.S. PATENT DOCUMENTS

| | | | | |
|---|---|---|---|---|
| 2015/0162435 | A1* | 6/2015 | Sahu | H10D 30/62 438/286 |
| 2020/0043802 | A1* | 2/2020 | Cheng | B82Y 10/00 |
| 2020/0066725 | A1 | 2/2020 | Bhuwalka | |

FOREIGN PATENT DOCUMENTS

| | | | |
|---|---|---|---|
| TW | 202107709 | A | 2/2021 |
| TW | 202137571 | A | 10/2021 |

* cited by examiner

ISOLATION FOR MULTIGATE DEVICES

This application is a non-provisional application of and claims benefit of U.S. Provisional Patent Application Ser. No. 63/255,485, filed Oct. 14, 2021, the entire disclosure of which is incorporated herein by reference.

BACKGROUND

Recently, multigate devices, which have gates that extend, partially or fully, around a channel to provide access to the channel on at least two sides, have been introduced to improve gate control. Multigate devices enable aggressive scaling down of IC technologies, maintaining gate control and mitigating short-channel effects (SCEs), while seamlessly integrating with conventional IC manufacturing processes. As multigate devices continue to scale, advanced techniques are needed for optimizing multigate device reliability and/or performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
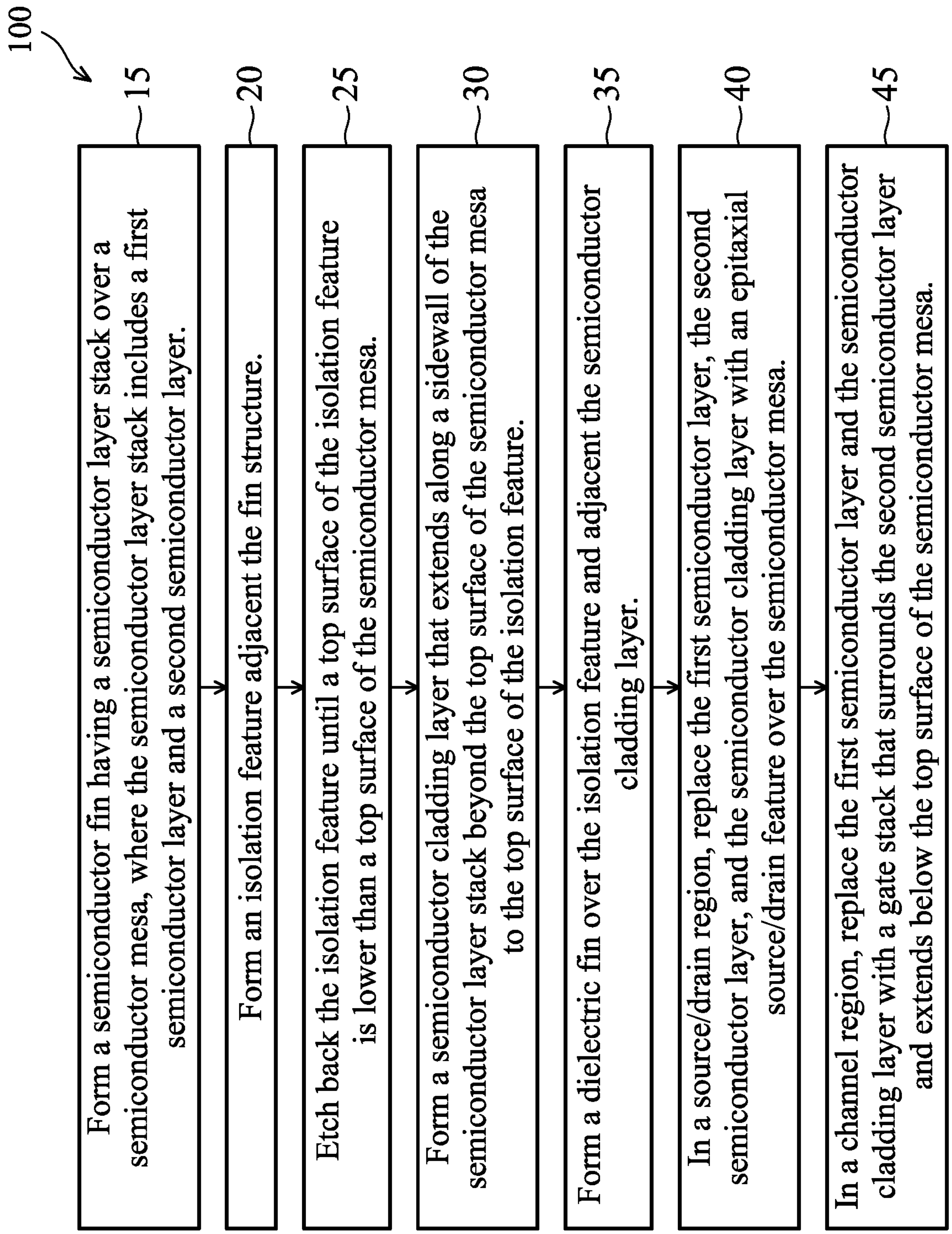
FIG. 1 is a flow chart of a method for fabricating a multigate device according to various aspects of the present disclosure.

The present disclosure relates generally to integrated circuit devices, and more particularly, to isolation techniques for multigate devices, such as fin-like field-effect transistors (FETs), gate-all-around (GAA) FETs, and/or other types of multigate devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below,"

"beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multigate devices include a gate structure that extends, partially or fully, around a channel region to provide access to a channel region on at least two sides. One such multigate device is the gate-all around (GAA) device, which includes channel layers (regions) that are vertically or horizontally stacked and suspended in a manner over a substrate that allows a gate stack to wrap around (or surround) the channel layers. GAA devices can significantly increase contact area between the gate stack and the channel regions, which has been observed to decrease subthreshold swing (SS), decrease short channel effects (SCEs), increase drive current, and/or improve channel control compared to other multigate devices, such as FinFETs.

The present disclosure proposes a GAA fabrication technique that includes forming sacrificial semiconductor layers, such as sacrificial silicon germanium layers, along sidewalls of a semiconductor fin before forming a dummy gate and a gate isolation fin, and forming the dummy gate after forming the gate isolation fin. With such technique, a dummy gate is formed over a top of the semiconductor fin, but not sidewalls of the semiconductor fin, in a channel region of a GAA device, and a gate replacement process includes removing the dummy gate from the top of the semiconductor fin to form a gate opening (as opposed to from the top and sidewalls of the semiconductor fin), removing the first semiconductor layers and the sacrificial semiconductor layers in the channel region exposed by the gate opening (i.e., enlarging the gate opening to surround the second semiconductor layers in the channel region of the GAA device), and filling the gate opening with a gate. The proposed GAA fabrication technique also modifies isolation structures to allow for sacrificial semiconductor layers to extend beyond a top surface of a semiconductor mesa of the semiconductor fin. For example, the proposed GAA fabrication technique includes, before forming the sacrificial semiconductor layers, forming an isolation feature adjacent the semiconductor fin and etching back the isolation feature until a top surface of the isolation feature is lower than a top surface of the semiconductor mesa. This allows for sacrificial semiconductor layers and the subsequently formed gate (which replaces the sacrificial semiconductor layers) to extend beyond the top surface of the semiconductor mesa to the isolation feature. Portions of the isolation feature may remain along sidewalls of the semiconductor mesa after the etching back, such that portions of the isolation feature are between the sidewalls of the semiconductor mesa and the sacrificial semiconductor layers and between the sidewalls of the semiconductor mesa and the subsequently formed gate. In some embodiments, the isolation feature includes a dielectric layer and a dielectric liner, a top surface of the dielectric layer is lower than a top surface of the semiconductor mesa, and the portions of the isolation feature remaining along sidewalls of the semiconductor mesa are the dielectric liner, a portion of which is not covered by the dielectric layer after the etching back.

The proposed GAA fabrication technique provides several advantages over conventional GAA fabrication techniques. As one example, because a dummy gate is formed after forming sacrificial semiconductor layers and gate isolation fins, the dummy gate covers a top, but not sidewalls, of the semiconductor fin, which eases removal of the dummy gate. For example, the etching process does not have to remove high aspect ratio dummy gates (e.g., where portions of dummy gates between sidewalls of a semiconductor fin and a gate isolation fin have relatively large lengths but relatively small widths, such as length to width ratios that are greater than about 10), which eliminates dummy gate residue from along sidewalls of channel layers and/or between channel layers and significantly improves contact between the subsequently formed gate and the sidewalls of channel layers and/or bottoms/tops of lower channel layers. As another example, portions of the sacrificial semiconductor layers that extend beyond the top surface of semiconductor mesa provide “feet” that anchor the sacrificial semiconductor layers and correspondingly the semiconductor fin to underlying device features (e.g., isolation features), such that the sacrificial semiconductor layers can structurally support the semiconductor fin and significantly reduce and/or eliminate fin bending and/or fin collapse. As yet another example, portions of the sacrificial semiconductor layers that extend beyond the top surface of semiconductor mesa de-foot the subsequently formed gate stack, for example, by pushing any gate footing and/or gate widening below top surfaces of the semiconductor mesa, which can minimize and/or eliminate protrusions of the gate stack into source/drain regions. Different embodiments may have different advantages, and no particular advantage is required of any embodiment. Details of the proposed multigate device fabrication techniques and resulting multigate devices are described herein in the following pages.

FIG. 1 is a flow chart of a method 10 for fabricating a multigate device according to various aspects of the present disclosure. At block 15, method 10 includes forming a semiconductor fin having a semiconductor layer stack over a semiconductor mesa. The semiconductor layer stack includes a first semiconductor layer and a second semiconductor layer. The first semiconductor layer is between the second semiconductor layer and the semiconductor mesa. At block 20, method 10 includes forming an isolation feature adjacent the fin structure. In some embodiments, the isolation feature includes a dielectric layer (e.g., oxide layer) over a dielectric liner. At block 25, method 10 includes etching back the isolation feature until a top surface of the isolation feature is lower than a top surface of the semiconductor mesa. In some embodiments, a top surface of the dielectric layer is lower than the top surface of the semiconductor mesa, and the etching back exposes the dielectric liner. At block 30, method 10 includes forming a semiconductor cladding layer that extends along a sidewall of the semiconductor layer stack beyond the top surface of the semiconductor mesa to the isolation feature. A portion of the semiconductor cladding layer below the top surface of the semiconductor mesa is a semiconductor foot, and in some embodiments, the isolation feature (e.g., dielectric liner) is between the semiconductor foot and the semiconductor mesa. At block 35, method 10 includes forming a dielectric fin (e.g., a gate isolation fin) over the isolation feature and adjacent the semiconductor cladding layer. The semiconductor foot is between the dielectric fin and the isolation feature. In some embodiments, the dielectric fin includes a lower portion and an upper portion, where the lower portion includes a dielectric layer (e.g., oxide layer) over a dielectric liner and the upper portion includes a high-k dielectric layer.

At block 40, method 10 includes, in a source/drain region, replacing the first semiconductor layer, the second semiconductor layer, and the semiconductor cladding layer with an epitaxial source/drain feature over the semiconductor mesa. In some embodiments, such replacement can include performing a first etching process to remove the first semiconductor layer and the second semiconductor layer, thereby forming a source/drain recess; performing a second etching process to remove the semiconductor cladding layer and laterally extend the source/drain recess, thereby exposing the isolation feature and the dielectric fin; and filling the source/drain recess with an epitaxial material. At block 45, method 10 includes, in a channel region, replacing the first semiconductor layer and the semiconductor cladding layer with a gate stack that surrounds the second semiconductor layer and extends below the top surface of the semiconductor mesa. A portion of the gate stack that extends below the top surface of the semiconductor mesa is a gate foot, which replaces the semiconductor foot of the semiconductor cladding layer. In some embodiments, the isolation feature (e.g., dielectric liner) is between the gate foot and the semiconductor mesa, and the gate foot is between the isolation feature and the dielectric fin. A length of the gate foot is greater than a length of the semiconductor foot, and/or a width of the gate foot is greater than a width of the semiconductor foot. Length and/or width differences between the gate foot and the semiconductor foot may result from slight etching of the dielectric fin when removing the first semiconductor layer and/or the semiconductor cladding layer. In some embodiments, such replacement can include performing an etching process that removes the first semiconductor layer and the semiconductor cladding layer from the channel region. In some embodiments, a dummy gate is formed over the semiconductor fin and the semiconductor cladding layer in a channel region after forming the dielectric fin, and the dummy gate is also replaced with the gate stack. In such embodiments, the dummy gate is removed to form a gate opening that exposes the first semiconductor layer and the semiconductor cladding layer in the channel region, which are subsequently removed. FIG. 1 has been simplified for the sake of clarity to better understand the inventive concepts of the present disclosure. Additional steps can be provided before, during, and after method 10, and some of the steps described can be moved, replaced, or eliminated for additional embodiments of method 10.

FIGS. 2A-2S, FIGS. 3A-3I, and FIGS. 4A-4D are fragmentary cross-sectional views of a multigate device 100, in portion or entirety, at various fabrication stages, such as those associated with method 10 in FIG. 1, according to various aspects of the present disclosure. FIGS. 2A-2S are taken (cut) through a source/drain region of multigate device 100 along a gate lengthwise direction, FIGS. 3A-3I are taken through source/drain regions and channel regions of multigate device 100 along a gate widthwise direction, and FIGS. 4A-4D are taken through a channel region of multigate device 100 along the gate lengthwise direction. FIGS. 3A-3I (e.g., gate cut views) correspond with the same fabrication stages of FIGS. 2J-2S (e.g., source/drain cut views), respectively. FIGS. 4A-4D (e.g., channel cut views) correspond with the same fabrication stages of FIGS. 2P-2S and FIGS. 3-3I, respectively. Multigate device 100 is fabricated to include at least one GAA transistor (i.e., a transistor having a gate that surrounds at least one suspended channel (for example, nanowires, nanosheets, nanobars, etc.), where the at least one suspended channel extends between epitaxial source/drains). In some embodiments, multigate device 100 is configured with at least one p-type GAA transistor and/or at least one n-type GAA transistor. Multigate device 100 may be included in a microprocessor, a memory, other IC device, or combinations thereof. In some embodiments, multigate device 100 is a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2A-2S, FIGS. 3A-3I, and FIGS. 4A-4D are discussed concurrently herein for ease of description and understanding. FIGS. 2A-2S, FIGS. 3A-3I, and FIGS. 4A-4D have been simplified for the sake of clarity to better understand the inventive concepts of the present disclosure. Additional features can be added in multigate device 100, and some of the features described below can be replaced, modified, or eliminated in other embodiments of multigate device 100.

Turning to FIG. 2A, multigate device 100 includes a semiconductor substrate (wafer) 105, a semiconductor layer stack 110 (including, for example, semiconductor layers 115 and semiconductor layers 120) over substrate 105, and a semiconductor mask layer 125 over semiconductor layer stack 110. Substrate 105 includes an elementary semiconductor, such as silicon and/or germanium; a compound semiconductor, such as silicon carbide, gallium arsenide, gallium phosphide, indium phosphide, indium arsenide, indium antimonide, or combinations thereof; an alloy semiconductor, such as silicon germanium (SiGe), GaAsP, AlInAs, AlGaAs, GaInAs, GaInP, GaInAsP, or combinations thereof; or combinations thereof. In the depicted embodiment, substrate 105 includes silicon. Substrate 105 can include various doped regions, such as p-type doped regions (referred to as p-wells), n-type doped regions (referred to as n-wells), or combinations thereof. N-wells include n-type dopants, such as phosphorus, arsenic, other n-type dopant, or combinations thereof. P-wells include p-type dopants, such as boron, indium, other p-type dopant, or combinations thereof. In some embodiments, doped regions in substrate 105 include a combination of p-type dopants and n-type dopants. The various doped regions can be formed directly on and/or in substrate 105, for example, providing a p-well structure, an n-well structure, a dual-well structure, a raised structure, or combinations thereof. An ion implantation process, a diffusion process, other suitable doping process, or combinations thereof can be performed to form the various doped regions.

A composition of semiconductor layers 115 is different than a composition of semiconductor layers 120 to achieve different etching selectivity and/or different oxidation rates during subsequent processing. In FIG. 2A, semiconductor layers 115 and semiconductor layers 120 include different materials, constituent atomic percentages, constituent weight percentages, thicknesses, and/or characteristics to achieve desired etching selectivity during an etching process, such as an etching process implemented to form suspended channel layers in channel regions of a multigate device. In the depicted embodiment, where semiconductor layers 115 include silicon germanium and semiconductor layers 120 include silicon, a silicon etch rate of semiconductor layers 120 is different than a silicon germanium etch rate of semiconductor layers 115 to a given etchant. In some embodiments, semiconductor layers 115 and semiconductor layers 120 include the same material but with different constituent atomic percentages to achieve the etching selectivity and/or different oxidation rates. For example, semiconductor layers 115 and semiconductor layers 120 can include silicon germanium, where semiconductor layers 115 and semiconductor layers 120 have different silicon atomic percentages and/or different germanium atomic percentages. Semiconductor layers 115 and semiconductor layers 120 include any combination of semiconductor materials that provides desired etching selectivity, desired oxidation rate differences, and/or desired performance characteristics (e.g., materials that maximize current flow), including any of the semiconductor materials disclosed herein.

Semiconductor layer stack 110 is formed by depositing semiconductor layers 115 and semiconductor layers 120 over substrate 105. Semiconductor layers 115 and semiconductor layers 120 are stacked vertically (e.g., along the z-direction) in an interleaving or alternating configuration from a top surface of substrate 105. In some embodiments, the depositing includes epitaxially growing semiconductor layers 115 and semiconductor layers 120 in the depicted interleaving and alternating configuration. For example, a first one of semiconductor layers 115 is epitaxially grown on substrate 105, a first one of semiconductor layers 120 is epitaxially grown on the first one of semiconductor layers 115, a second one of semiconductor layers 115 is epitaxially grown on the first one of semiconductor layers 120, and so on until semiconductor layer stack 110 has a desired number of semiconductor layers 115 and semiconductor layers 120. In such embodiments, semiconductor layers 115 and semiconductor layers 120 can be referred to as epitaxial layers. Semiconductor layers 115 and semiconductor layers 120 may be epitaxially grown by molecular beam epitaxy (MBE), chemical vapor deposition (CVD), metalorganic (MOCVD), other suitable epitaxial growth process, or combinations thereof.

In some embodiments, semiconductor layers 115 and semiconductor layers 120 are formed by a selective CVD process, such as remote plasma CVD (RPCVD), that introduces a silicon-containing precursor and/or a germanium-containing precursor and a carrier gas into a process chamber, where the silicon-containing precursor and/or the germanium-containing precursor interact with semiconductor surfaces of multigate device 100 to form semiconductor layers 115 and semiconductor layers 120, respectively. The silicon-containing precursor includes $SiH_4$, $Si_2H_6$, DCS, $SiHCl_3$, $SiCl_4$, other suitable silicon-containing precursors, or combinations thereof. The germanium-containing precursor includes $GeH_4$, $Ge_2H_6$, $GeCl_4$, $GeCl_2$, other suitable germanium-containing precursors, or combinations thereof. The carrier gas may be an inert gas, such as $H_2$. In the depicted embodiment, semiconductor layers 115 and semiconductor layers 120 are epitaxially grown in a same process chamber and precursor characteristics are tuned and alternated to form semiconductor layers 115 and semiconductor layers 120. For example, a silicon-containing precursor (e.g., $SiH_4$) and a carrier precursor (e.g., $H_2$) are introduced into the process chamber when depositing semiconductor layers 120 and the silicon-containing precursor, the carrier precursor, and a germanium-containing precursor (e.g., $GeH_4$) are introduced into the process chamber when depositing semiconductor layers 115. In some embodiments, the selective CVD process introduces a dopant-containing precursor into the process chamber to facilitate in-situ doping of semiconductor layers 115 and semiconductor layers 120. The dopant-containing precursor includes boron (e.g., $B_2H_6$), phosphorous (e.g., $PH_3$), arsenic (e.g., $AsH_3$), other suitable dopant-containing precursors, or combinations thereof. In some embodiments, the selective CVD processes introduce an etchant-containing precursor into the process chamber to prevent or limit growth of silicon material and/or germanium material on dielectric surfaces and/or non-semiconductor surfaces. In such embodiments, parameters of the selective CVD processes are tuned to ensure net deposition of semiconductor material on semiconductor surfaces. The etchant-containing precursor includes $Cl_2$, HCl, other etchant-containing precursors that can facilitate desired semiconductor material (e.g., silicon and/or germanium) growth selectivity, or combinations thereof.

Semiconductor hard mask layer 125 includes an elementary semiconductor, such as silicon and/or germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In the depicted embodiment, semiconductor hard mask layer 125 includes silicon germanium, and a thickness of semiconductor hard mask layer 125 is greater than a thickness of semiconductor layers 115. In some embodiments, semiconductor hard mask layer 125 is deposited by an epitaxial growth process, such as those used to form semiconductor layers 115. In some embodiments, semiconductor hard mask layer 125 is deposited over topmost semiconductor layer 120 in the same process chamber used to form semiconductor layers 120 and semiconductor layers 115. In such embodiments, a time of the selective CVD for depositing semiconductor hard mask layer 125 (i.e., where multigate device 100 is exposed to the silicon-containing precursor, the carrier precursor, and the germanium-containing precursor) is longer than a time of the selective CVD for depositing semiconductor layers 115 to provide thicker semiconductor hard mask layer 125.

Figure 2B:
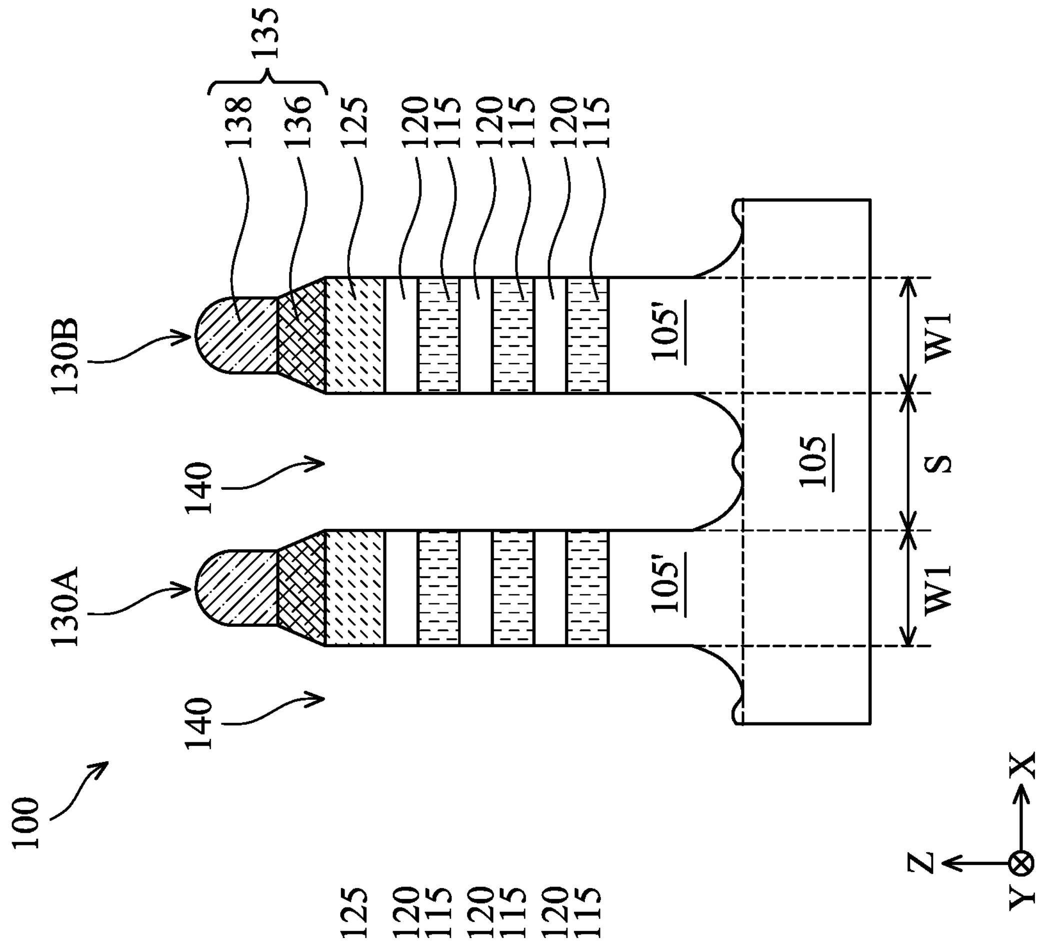
FIGS. 2A-2S, FIGS. 3A-3I, and FIGS. 4A-4D are fragmentary cross-sectional views of a multigate device, in portion or entirety, at various fabrication stages, such as those associated with the method of FIG. 1, according to various aspects of the present disclosure.
Figure 2A:
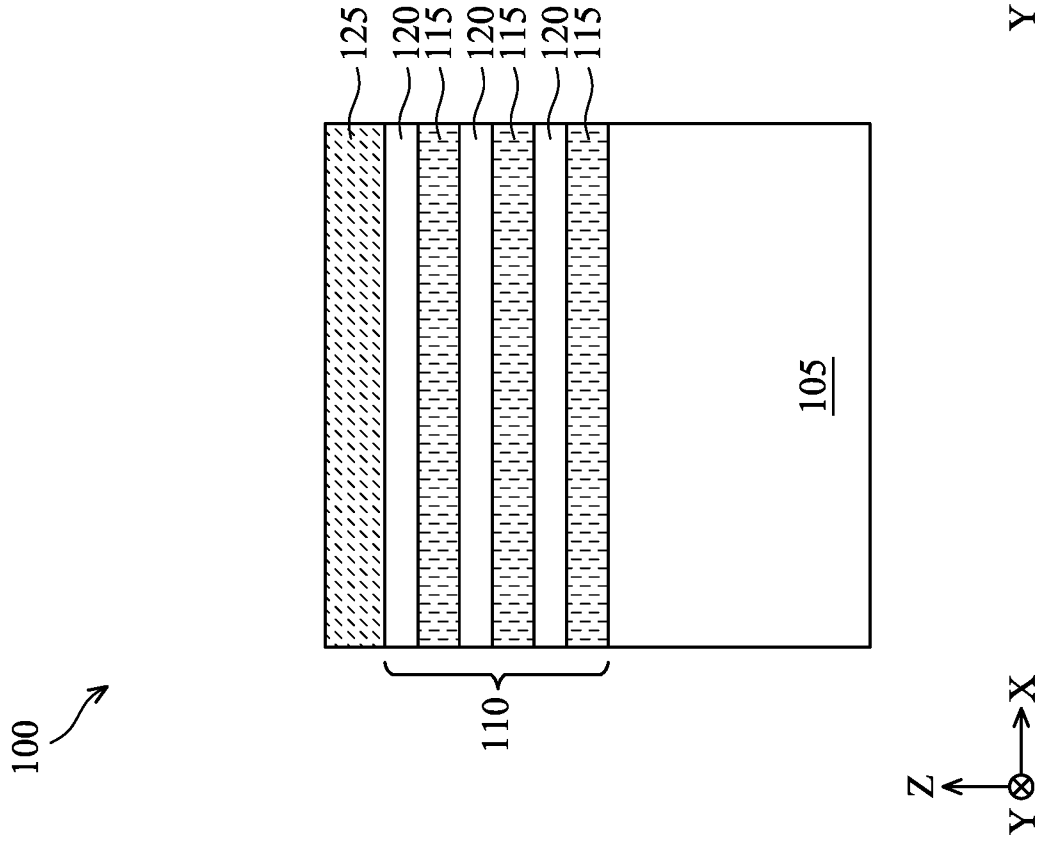

Turning to FIG. 2B, semiconductor layer stack 110 and substrate 105 are patterned to form fins, such as a fin 130A and a fin 130B, extending from substrate 105. Fin 130A and fin 130B each extend substantially parallel to one another along the y-direction, having a length in the y-direction, a width in the x-direction, and a height in the z-direction. Fin 130A and fin 130B each include a substrate portion (i.e., a patterned, projecting portion of semiconductor substrate 105, which can be referred to as a semiconductor mesa 105', a fin portion of substrate 105, a substrate extension, a substrate fin portion, an etched substrate portion, etc.), a semiconductor layer stack portion (i.e., a portion of semiconductor layer stack 110 that includes semiconductor layers 115 and semiconductor layers 120) over the substrate portion, and a patterning layer portion (i.e., a patterning layer 135) over the semiconductor layer stack portion. Fin 130A and fin 130B have a width W1 (here, along the x-direction), and fin 130A and fin 130B have a spacing S (here, along the x-direction) therebetween. In some embodiments, width W1 is about 5 nm to about 30 nm. In some embodiments, spacing S is about 10 nm to about 50 nm.

Patterning layer 135 includes a material that is different than a material of semiconductor layer stack 110 and substrate 105 to achieve etching selectivity during subsequent processing, such that semiconductor layer stack 110 and/or substrate 105 can be selectively etched with minimal (or no) etching of patterning layer 135, and vice versa. In the depicted embodiment, patterning layer 135 includes a pad layer 136 deposited on semiconductor hard mask layer 125 and a mask layer 138 deposited on pad layer 136. In some embodiments, pad layer 136 and mask layer 138 are dielectric hard mask layers. For example, pad layer 136 and mask layer 138 each include silicon, oxygen, nitrogen, carbon, and/or other suitable dielectric constituent. In some embodiments, pad layer 136 includes a silicon nitride layer or a silicon oxynitride layer disposed over a silicon oxide layer, and mask layer 138 is a silicon oxide layer. In some embodiments, the silicon oxide layer of pad layer 136 is formed by thermal oxidation and/or other suitable process, and the silicon nitride layer of pad layer 136 is formed by CVD, low pressure CVD (LPCVD), plasma enhanced CVD (PECVD), thermal nitridation (for example, of silicon), other suitable process, or combinations thereof. In some embodiments, mask layer 138 is formed by PECVD (e.g., mask layer is a plasma-enhanced oxide (PEOX) layer). Pad layer 136 can include a material that promotes adhesion between semiconductor layer stack 110 and mask layer 138, functions as an etch stop layer when etching mask layer 138, and/or functions as a planarization stop layer when forming isolation features. Other materials for and/or methods for forming pad layer 136 and/or mask layer 138, along with other configurations of patterning layer 135, are contemplated by the present disclosure.

After forming patterning layer 135 over semiconductor layer stack 110, a lithography and/or etching process is performed to pattern patterning layer 135, semiconductor layer stack 110, and substrate 105. The lithography process can include forming a resist layer over patterning layer 135 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of the semiconductor layer stack using the patterned resist layer as an etch mask. In some embodiments, the patterned resist layer is formed over a mask layer disposed over the semiconductor layer stack, a first etching process removes portions of the mask layer to form patterning layer 135 (i.e., a patterned hard mask layer), and a second etching process removes portions of semiconductor layer stack 110 and/or portions of substrate 105 using patterning layer 135 as an etch mask. The etching process can include a dry etch, a wet etch, other suitable etch, or combinations thereof. After the etching process, the patterned resist layer is removed, for example, by a resist stripping process or other suitable process.

In some embodiments, fin 130A and fin 130B are formed by a multiple patterning process, such as a double patterning lithography (DPL) process (e.g., a lithography-etch-lithography-etch (LELE) process, a self-aligned double patterning (SADP) process, a spacer-is-dielectric (SID) process, other double patterning process, or combinations thereof), a triple patterning process (e.g., a lithography-etch-lithography-etch-lithography-etch (LELELE) process, a self-aligned triple patterning (SATP) process, other triple patterning process, or combinations thereof), and/or other multiple patterning process (e.g., self-aligned quadruple patterning (SAQP) process). Such processes can also provide fin 130A and fin 130B each with a respective patterning layer 135, a respective semiconductor layer stack 110, and a respective semiconductor mesa 105'. In some embodiments, directed self-assembly (DSA) techniques are implemented while patterning semiconductor layer stack 110 and/or substrate 105.

Figure 2C:
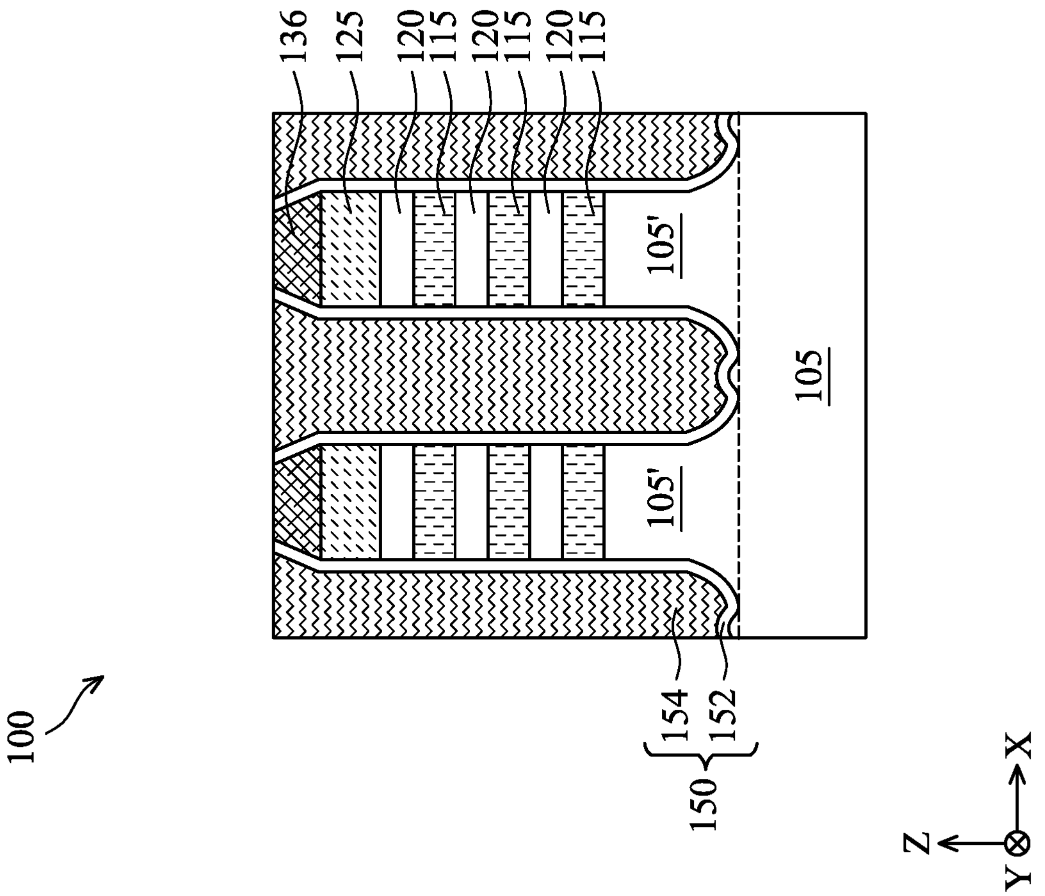

Trenches 140 are formed between and/or surrounding fin 130A and fin 130B. Turning to FIG. 2C, processing includes forming isolation features 150 in trenches 140. In some embodiments, isolation features 150 are formed by depositing a dielectric layer over multigate device 100 that partially fills trenches 140, depositing an oxide material over multigate device 100 (in particular, over the dielectric layer) that fills remainders of trenches 140, and performing a planarization process. The planarization process, such as a chemical mechanical polishing (CMP) process, is performed until reaching and exposing pad layers 136 (i.e., pad layers 136 function as planarization stop layers). The planarization process removes mask layers 138 and any of the dielectric layer and/or the oxide material over mask layers 138 and/or above top surfaces of pad layers 136. Remainders of the dielectric layer and the oxide material form dielectric liners 152 and oxide layers 154, respectively, of isolation features 150. The planarization process may remove portions of pad layers 136. For example, the planarization process may remove top layers of pad layers 136 (e.g., silicon oxide layers) and expose underlying layers of pad layers 136 (e.g., silicon nitride layers). In such embodiments, the planarization process reduces thicknesses of pad layers 136 of fin 130A and fin 130B.

The dielectric layer (i.e., dielectric liners 152) is formed by atomic layer deposition (ALD), CVD, physical vapor deposition (PVD), high density plasma CVD (HDPCVD), MOCVD, RPCVD, PECVD, LPCVD, atomic layer CVD (ALCVD), atmospheric pressure CVD (APCVD), sub-atmospheric CVD (SACVD), other suitable methods, or combinations thereof. Dielectric liners 152 cover sidewalls of trenches 140, which are formed by sidewalls of semiconductor layer stacks 110 and sidewalls of pad layers 136, and bottoms of trenches 140, which are formed by semiconductor mesas 105' and/or substrate 105. Dielectric liners 152 include a suitable dielectric material, such as an oxygen-comprising dielectric material (e.g., a dielectric material that includes oxygen in combination with silicon, carbon, and/or nitrogen). For example, dielectric liners 152 include silicon oxide, silicon oxynitride, and/or silicon oxycarbonitride. In such embodiments, dielectric liners 152 can be referred to as oxide liners. In some embodiments, dielectric liners 152 include n-type dopants and/or p-type dopants. In some embodiments, the dielectric layer (i.e., dielectric liners 152) functions as a seed layer for subsequent growth and/or deposition of the oxide material (i.e., oxide layers 154).

In the depicted embodiment, the oxide material (i.e., oxide layers 154) is formed by flowable CVD (FCVD), which can include depositing a flowable oxide material (for example, in a liquid state) over multigate device 100 and converting the flowable oxide material into a solid oxide material by an annealing process. The flowable oxide material can flow into trenches 140 and conform to exposed surfaces of multigate device 100. In some embodiments, the flowable oxide material is a flowable silicon-and-oxygen material, and the annealing process converts the flowable silicon-and-oxygen material into a silicon-and-oxygen layer, such as a silicon oxide layer. In some embodiments, the annealing process is a thermal annealing that can heat multigate device 100 to a temperature that facilitates conversion of the flowable oxide material into the solid oxide material. In some embodiments, the annealing process exposes the flowable oxide material to UV radiation. In some embodiments, the annealing process is performed before performing the planarization process. In some embodiments, oxide material is deposited by a high aspect ratio deposition (HARP) process. In some embodiments, the oxide material is deposited by HDPCVD. In some embodiments, an annealing process is performed after the planarization process to further cure and/or densify oxide layers 154.

Figure 2D:
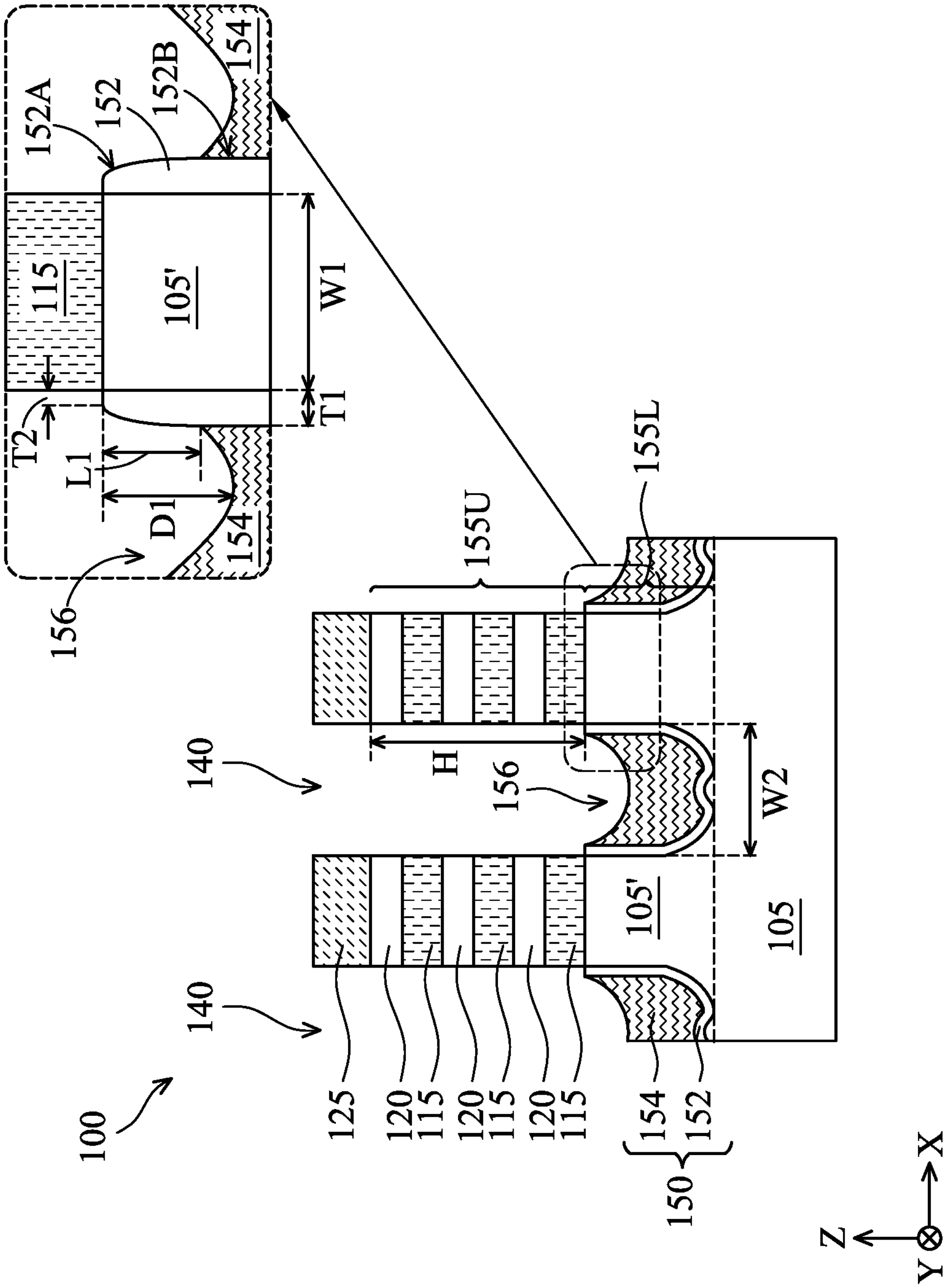

Turning to FIG. 2D, isolation features 150 are recessed and/or etched back, such that fin 130A and fin 130B extend (protrude) from isolation features 150. Isolation features 150 fill lower portions of trenches 140 and surround portions of fin 130A and fin 130B. Isolation features 150 have a width W2, which is about equal to spacing S between fin 130A and fin 130B. In some embodiments, width W2 is about 10 nm to about 50 nm. Portions of fin 130A and fin 130B extending from top surfaces of isolation features 150 are designated as upper fin active regions 155U and portions of fin 130A and fin 130B surrounded by isolation features 150 are designated as lower fin active regions 155L. Isolation features 150 electrically isolate active device regions and/or passive device regions of multigate device 100 from each other. For example, isolation features 150 separate and electrically isolate fin 130A and fin 130B, fin 130A from other device regions of multigate device 100, and fin 130B from other device regions of multigate device 100. Various dimensions and/or characteristics of isolation features 150 can be configured to achieve shallow trench isolation (STI) structures, deep trench isolation (DTI) structures, local oxidation of silicon (LOCOS) structures, other suitable isolation structures, or combinations thereof. In the depicted embodiment, isolation features 150 are STIs.

In some embodiments, an etching process selectively removes isolation features 150 with respect to semiconductor layers of fin 130A and fin 130B. In other words, the etching process substantially removes isolation features 150 but does not remove, or does not substantially remove, semiconductor mask layers 125, semiconductor layers 120, and semiconductor layers 115. For example, an etchant is selected for the etch process that etches dielectric materials (e.g., oxide layers 154, dielectric liners 152, and/or pad layers 136) at a higher rate than semiconductor materials (e.g., semiconductor mask layers 125, semiconductor layers 120, and semiconductor layers 115). The etching process is a dry etch, a wet etch, other suitable etching process, or combinations thereof. In some embodiments, the etching process removes pad layers 136. In some embodiments, pad layers 136 function as etch masks during the etching process. In some embodiments, a first etching process etches back oxide layers 154 and a second etching process etches back dielectric liners 152. The first etching process may selectively remove oxide layers 154 with respect to dielectric liners 152, and the second etching process may selectively remove dielectric liners 152 with respect to oxide layers 154. In some embodiments, the first etching process partially removes dielectric liners 152 and/or the second etching process partially removes oxide layers 154. In some embodiments, the second etching process is a fin trimming process that reduces dimensions of fin 130A and fin 130B (e.g., reduces widths of fin 130A and fin 130B from a first width to a second width) and/or modifies a profile of fin 130A and fin 130B. For example, where fin 130A and fin 130B have tapered profiles (e.g., tapered sidewalls and a width that increases along a height of fin 130A and fin 130B), the fin trimming process can reduce sidewall tapering to provide fin 130A and fin 130B with substantially vertical sidewalls and/or substantially uniform widths along their heights.

The etching process recesses isolation features 150 until achieving a target height of upper fin active regions 155U. In FIG. 2D, a height of isolation features 150 (here, along the z-direction) is about the same as a height of semiconductor mesas 105', and upper fin active regions 155U having a height H are formed by semiconductor layer stacks 110. In some embodiments, height H is about 30 nm to about 60 nm. In some embodiments, semiconductor layer stacks 110 are partially, instead of fully, exposed by the etching process, and a height of isolation features 150 is greater than a height of semiconductor mesas 105'. In such embodiments, isolation features 150 are below bottommost semiconductor layers 120. In some embodiments, semiconductor mesas 105' are partially exposed by the etching process, and a height of isolation features 150 is less than a height of semiconductor mesas 105'.

In some embodiments, oxide layers 154 are etched back further than dielectric liners 152, thereby forming recesses 156 in isolation features 150. In the depicted embodiment, recesses 156 have a depth D1 below upper fin active regions 155U (here, along the z-direction), which is a distance between top surfaces of semiconductor mesas 105' and top, curved surfaces of oxide layers 154. In some embodiments, depth D1 is about 3 nm to about 40 nm. In some embodiments, the top, curved surfaces of oxide layers 154 are concave surfaces.

Over etching of oxide layers 154 exposes portions of dielectric liners 152, such that dielectric liners 152 have liner portions 152A, which are not covered by oxide layers 154, and liner portions 152B, which are covered by oxide layers 154. Liner portions 152A have a length L1 (here, along the z-direction) and form sidewalls of recesses 156. In some embodiments, length L1 is about 3 nm to about 20 nm. In some embodiments, before the etching process, dielectric liners 152 have opposing surfaces (e.g., an outer surface that shares an interface with semiconductor mesas 105' and substrate 105 and an inner surface that shares an interface with oxide layers 154) that have substantially the same profiles, and dielectric liners 152 have substantially uniform thicknesses, such as a thickness T1. The etching process may modify profiles of the inner surfaces of the exposed portions of the dielectric liners 152, such that liner portions 152A and liner portions 152B have different physical characteristics after the etching process. For example, the etching process may round the inner surfaces of the exposed portions of dielectric liners 152, thereby providing liner portions 152A with opposing surfaces having different profiles (e.g., curved inner surfaces and linear outer surfaces), while liner portions 152B have opposing surfaces with substantially the same profiles (e.g., linear inner surfaces and linear outer surfaces). In some embodiments, liner portions 152A have a thickness (here, along the x-direction) that is less than thickness T1 and liner portions 152B, which are not exposed to the etching process, have thickness T1 (here, along the x-direction). In some embodiments, a thickness of liner portions 152A increases from a thickness T2 to thickness T1 along length L1. In some embodiments, thickness T1 is about 1 nm to about 5 nm. In some embodiments, thickness T2 is about 1 nm to about 3 nm. In some embodiments, a thickness of liner portions 152A increases from about 1 nm to about 5 nm along length L1. In some embodiments, a thickness of liner portions 152A varies along length L1 depending on its profile.

Figure 2E:
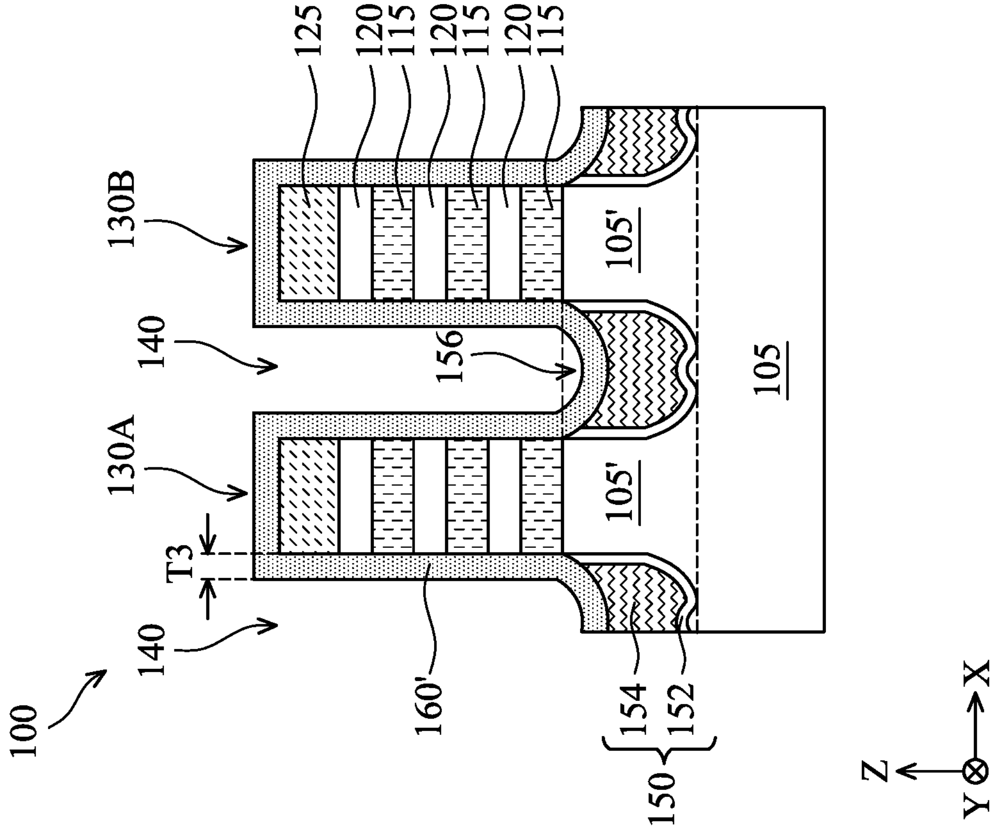

Turning to FIG. 2E, a silicon germanium layer 160' is deposited over multigate device 100 by ALD, CVD, PVD, HDPCVD, MOCVD, RPCVD, PECVD, LPCVD, ALCVD, APCVD, SACVD, other suitable deposition methods, or combinations thereof. In some embodiments, silicon germanium layer 160' is formed by a conformal deposition process and conforms to surfaces of multigate device 100 as deposited thereover. In FIG. 2E, silicon germanium layer 160' has a substantially uniform thickness, such as a thickness T3, and covers tops of fin 130A and fin 130B, sidewalls of fin 130A and fin 130B, sidewalls of recesses 156, and bottoms of recesses 156. In some embodiments, silicon germanium layer 160' wraps fin 130A and fin 130B, partially fills recesses 156, and partially fills upper portions of trenches 140. In the depicted embodiment, thickness T3 is less than depth D1 of recesses 156. In some embodiments, thickness T3 is about 5 nm to about 12 nm. In some embodiments, thickness T3 is greater than or equal to depth D1 of recesses 156. In some embodiments, thickness T3 is greater than or equal to a target thickness for sacrificial silicon germanium layers 160 (also referred to as silicon germanium cladding layers) along sidewalls of fin 130A and fin 130B.

Figure 2F:
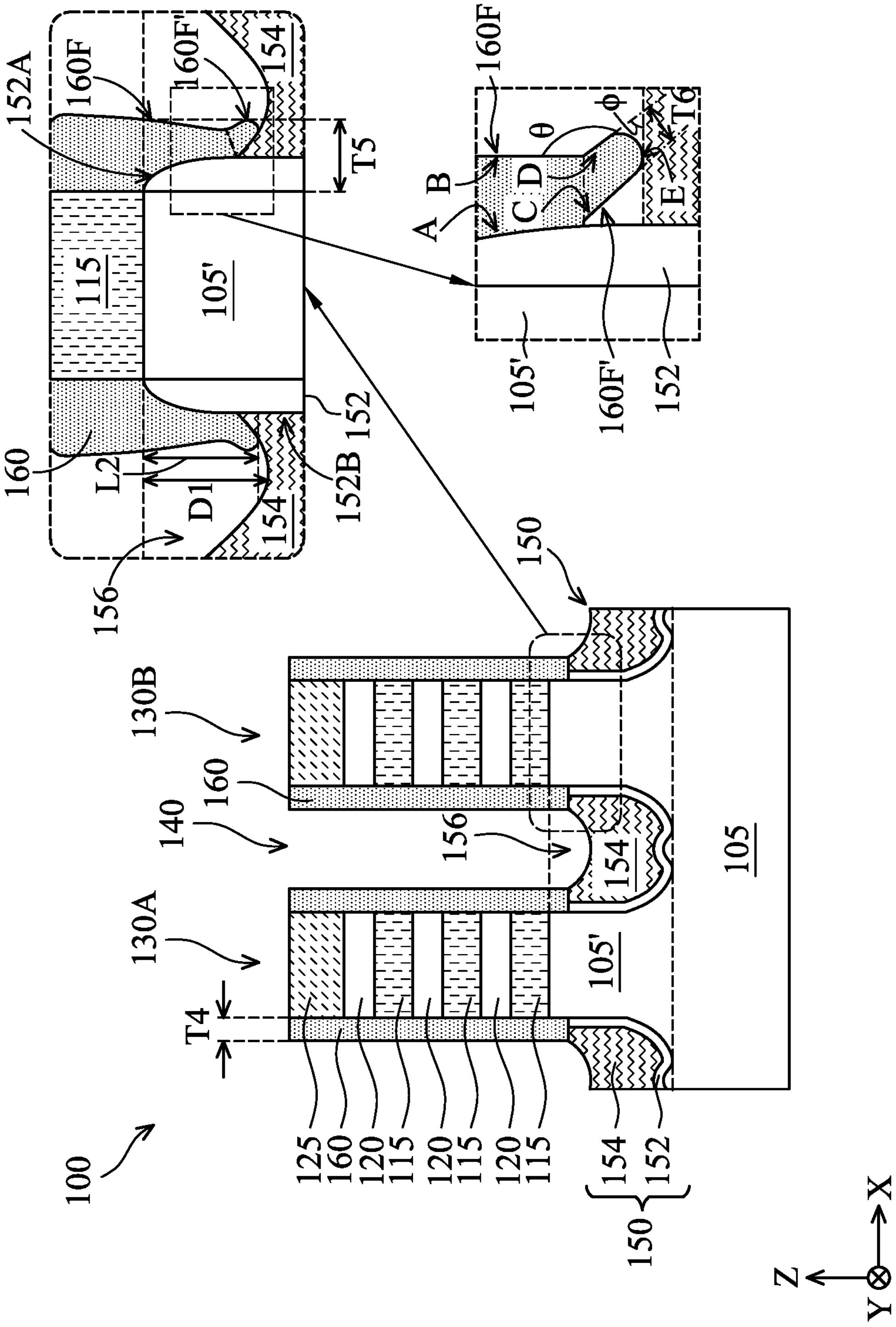

Turning to FIG. 2F, portions of silicon germanium layer 160' are removed by an etching process, such as a dry etch, a wet etch, other suitable etching process, or combinations thereof. Remaining portions of silicon germanium layer 160' form sacrificial silicon germanium layers 160, which cover sidewalls of fin 130A and fin 130B (e.g., sidewalls of semiconductor mask layers 125 and sidewalls of semiconductor layer stacks 110). In the depicted embodiment, because top surfaces of isolation features 150 (in particular, top surfaces of oxide layers 154 of isolation features 150) are below top surfaces of semiconductor mesas 105', sacrificial silicon germanium layers 160 extend beyond upper fin active regions 155U, below top surfaces of semiconductor mesas 105' to oxide layers 154 of isolation features 150. In some embodiments, sacrificial silicon germanium layers 160 cover liner portions 152A of dielectric liners 152. In some embodiments, sacrificial silicon germanium layers 160' physically contact dielectric liners 152 and oxide layers 154. Sacrificial silicon germanium layers 160 extend lengthwise along the z-direction and have a thickness T4 (here, along the x-direction). Thickness T4 is greater than a thickness of liner portions 152A. For example, thickness T4 is greater than thickness T2 of liner portions 152A. In FIG. 2F, where bottom portions of liner portions 152A have thickness T1, thickness T4 is also greater than thickness T1. In some embodiments, thickness T4 is about 5 nm to about 20 nm. Thickness T4 is less than or equal to thickness T3. For example, a thickness of silicon germanium layer 160' along sidewalls of fin 130A and fin 130B may be reduced by the etching process, such that thickness T4 is less than thickness T3.

Portions of sacrificial silicon germanium layers 160 that are below top surfaces of semiconductor mesas 105' are referred to as feet 160F. Feet 160F anchor sacrificial silicon germanium layers 160 to isolation features 150, and correspondingly, anchor fin 130A and fin 130B to isolation features 150 since sacrificial silicon germanium layers 160 abut sidewalls of fin 130A and fin 130B. Feet 160F thus enhance structural stability of sacrificial silicon germanium layers 160, and sacrificial silicon germanium layers 160 having feet 160F can structurally support fin 130A and fin 130B, which can reduce (and, in some embodiments, eliminate) instances of bending and/or collapsing of fin 130A and/or fin 130B during subsequent processing as fin aspect ratios increase with scaling IC technologies. In FIG. 2F, feet 160F cover liner portions 152A of dielectric liners 152, partially fill recesses 156, physically contact dielectric liners 152, and physically contact oxide layers 154. Feet 160F have a length L2 (here, along the z-direction) that is greater than length L1 of liner portions 152A and less than depth D1 of recesses 156. In some embodiments, length L2 is about 3 nm to about 20 nm. Sacrificial silicon germanium layers 160 having feet 160F with length L2 less than about 3 nm may not be sufficiently anchored to isolation features 150 and thus provide insufficient structural support to fin 130A and/or fin 130B, which can result in fin collapse and/or fin bending. Feet 160F have surfaces A and surfaces B that are opposite surfaces A. Surfaces A physically contact liner portions 152A, surfaces B extend substantially vertically (here, along the z-direction), and a thickness T5 of feet 160F is between surfaces A and surfaces B. In some embodiments, thickness T5 is substantially equal to thickness T4. In some embodiments, thickness T5 decreases from thickness T4 to a thickness less than thickness T4 along length L2 of feet 160F. In some embodiments, thickness T5 varies along lengths of feet 160F depending on thickness variations of liner portions 152 along length L1 and variations in surfaces B.

Feet 160F have bottom portions 160F' that laterally extend beyond liner portions 152A of dielectric liners 152 and along the curved, top surfaces of oxide layers 154. Bottom portions 160F' extend laterally (e.g., along the x-direction) beyond surfaces B of feet 160F. Bottom portions 160F' have surfaces C and surfaces D that are opposite surfaces C. Surfaces C physically contact oxide layers 154, surfaces C extend from surfaces A, and surfaces D extend from surfaces B. Bottom portions 160F further have surfaces E that extend from surfaces C to surfaces D. Surfaces E are tips of feet 160F and do not physically contact dielectric liners 152 and/or oxide layers 154. In the depicted embodiment, surfaces E are curved surfaces. A thickness T6 is between surfaces C and surfaces D. Thickness T6 is less than thickness T5. In some embodiments, thickness T6 is about 0.5 nm to about 2 nm. Bottom portions 160F' each have a corresponding necking angle θ with respect to an axis that is parallel with a lengthwise direction of sacrificial silicon germanium layers 160 (e.g., z-axis) and a corresponding footing angle φ with respect to an axis that is perpendicular to the lengthwise direction of sacrificial silicon germanium layers 160 (e.g., x-axis). The etching process may be configured to ensure that necking angle θ and footing angle φ are within defined ranges that can optimize an etching process used to remove sacrificial silicon germanium layers 160 during subsequent processing, such as when replacing sacrificial silicon germanium layers 160 with epitaxial source/drain features and/or gate stacks as described further below. In some embodiments, necking angle θ is about 125° to about 179°. In some embodiments, footing angle φ is about 10° to about 63°. Necking angles less than about 125° and/or footing angles less than about 10° may result in under-etching. For example, an etching process implemented to remove sacrificial silicon germanium layers 160 may be unable to sufficiently remove bottom portions 160F' (which may be relatively thick compared to thickness T5), such that silicon germanium residue remains on liner portions 152A and/or oxide layers 154. Necking angles greater than about 179° and/or footing angles greater than about 63° may result in over-etching. For example, an etching process implemented to remove sacrificial silicon germanium layers 160 and ensure substantially complete removal of bottom portions 160F' (which may be relatively thin compared to thickness T5) may unintentionally remove portions of surrounding features, such as isolation features 150, dielectric fins 170, and/or semiconductor layers 120.

In some embodiments, the etching process is an anisotropic etch process, which generally refers to an etch process having different etch rates in different directions, such that the etch process removes material in specific directions. For example, the etching has a vertical etch rate that is greater than a horizontal etch rate (in some embodiments, the horizontal etch rate equals zero). The anisotropic etch process thus removes material in substantially the vertical direction (here, z-direction) with minimal (to no) material removal in the horizontal direction (here, x-direction and/or y-direction). In such embodiments, the anisotropic etch does not remove, or minimally removes, portions of silicon germanium layer 160' that cover sidewalls of fin 130A and fin 130B (e.g., sidewalls of semiconductor mask layers 125, semiconductor layers 120, and semiconductor layers 115) and portions of silicon germanium layer 160' that cover sidewalls of recesses 156 (e.g., liner portions 152A of dielectric liners 152), but removes portions of silicon germanium layer 160' that cover tops fin 130A and fin 130B (e.g., top surfaces of semiconductor mask layers 125) and portions of silicon germanium layer 160' that cover bottoms of recesses 156 (e.g., curved, top surfaces of oxide layers 154).

Turning to FIGS. 2G-21, processing includes forming dielectric fins 170 over isolation features 150. Dielectric fins 170 fill remainders of upper portions of trenches 140 and extend below top surfaces of semiconductor mesas 105' to fill remainders of recesses 156 in isolation layers 150. Each dielectric fin 170 includes a lower portion, which includes a dielectric liner 172 and an oxide layer 174, and an upper portion, which includes dielectric liner 172 and a high-k dielectric layer 176. In the lower portion, dielectric liner 172 wraps oxide layer 174, dielectric liner 172 is between oxide layer 174 and sacrificial silicon germanium layers 160, and dielectric liner 172 is between oxide layer 174 and oxide layer 154. In the upper portion, dielectric liner 172 is between high-k dielectric layer 176 and sacrificial silicon germanium layers 160. In some embodiments, oxide layer 174 physically contacts dielectric liner 172 and high-k dielectric layer 176, and dielectric liner 172 physically contacts oxide layer 154, sacrificial silicon germanium layers 160, oxide layer 174, and high-k dielectric layer 176. In some embodiments, high-k dielectric layer 176 physically contacts sacrificial silicon germanium layers 160, such as where portions of dielectric liner 172 that cover sacrificial silicon germanium layers 160 are at least partially removed during fabrication of dielectric fins 170.

Dielectric liners 172 include a silicon-comprising dielectric material, such as a dielectric material that includes silicon in combination with oxygen, carbon, and/or nitrogen. For example, dielectric liners 172 include silicon oxide, silicon nitride, silicon carbide, silicon carbonitride, silicon oxynitride, silicon oxycarbide, silicon oxycarbonitride, or combinations thereof. In the depicted embodiment, dielectric liners 172 are silicon oxycarbonitride (SiCN) layers, which can enhance isolation of semiconductor mesas 105' (and upper fin active regions 155U thereover). Oxide layers 174 include an oxygen-comprising dielectric material. In some embodiments, oxide layers 174 are similar to oxide layers 250. For example, oxide layers 174 include silicon and oxygen (e.g., silicon oxide). High-k dielectric layers 176 include a high-k dielectric material, which generally refers to dielectric materials having a high dielectric constant (k value) relative to a dielectric constant of silicon dioxide (k≈3.9). In some embodiments, high-k dielectric layers 176 include $HfO_2$, $HfSiO_x$ (e.g, HfSiO or $HfSiO_4$), HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$, (Ba,Sr)$TiO_3$, $HfO_2$—$Al_2O_3$, other suitable high-k dielectric material, or combinations thereof. In some embodiments, and high-k dielectric layers 176 are metal oxide layers, such as hafnium oxide (e.g., $HfO_x$) layers, aluminum oxide ($AlO_x$) layers, zirconium oxide ($ZrO_x$) layers, or combinations thereof, where x is a number of oxygen atoms in the dielectric material of and high-k dielectric layers 176. In the depicted embodiment, high-k dielectric layers 176 are hafnium oxide layers (e.g., $HfO_2$). In some embodiments, dielectric liners 172 and/or high-k dielectric layers 176 include n-type dopants and/or p-type dopants. For example, dielectric liners 172 may be boron-doped nitride liners.

Figure 2G:
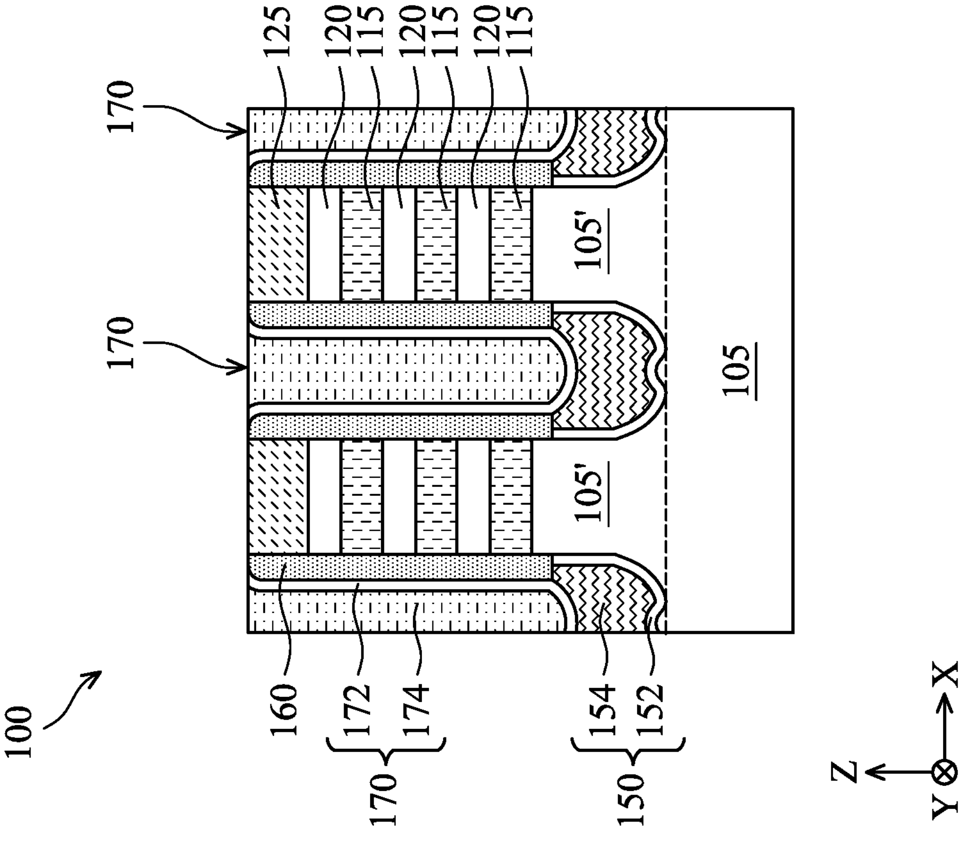

In some embodiments, dielectric fins 170 are formed over isolation features 150 by depositing a dielectric layer over multigate device 100, where the dielectric layer partially fills upper portions of trenches 140 (FIG. 2G); depositing an oxide material over the dielectric layer, where the oxide material fills remainders of upper portions of trenches 140 (FIG. 2G); and performing a planarization process, such as CMP, to remove the oxide material and/or the dielectric layer from over top surfaces of semiconductor mask layers 125 (FIG. 2G). In such embodiments, semiconductor mask layers 125 function as a planarization (e.g., CMP) stop layers, and the planarization process is performed until reaching and exposing semiconductor mask layers 125. Remainders of the oxide material and the dielectric layer form dielectric liners 172 and oxide layers 174 of dielectric fins 170, which combine with sacrificial silicon germanium layers 160 to fill upper portions of trenches 140 while isolation features 150 fill lower portions of trenches 140. The dielectric layer is formed by ALD, CVD, PVD, HDPCVD, MOCVD, RPCVD, PECVD, LPCVD, ALCVD, APCVD, SACVD, other suitable deposition methods, or combinations thereof. The oxide material is formed by FCVD, HPCVD, HARP, CVD, other suitable deposition methods, or combinations thereof. In the depicted embodiment, the oxide material is deposited by FCVD.

Figure 2H:
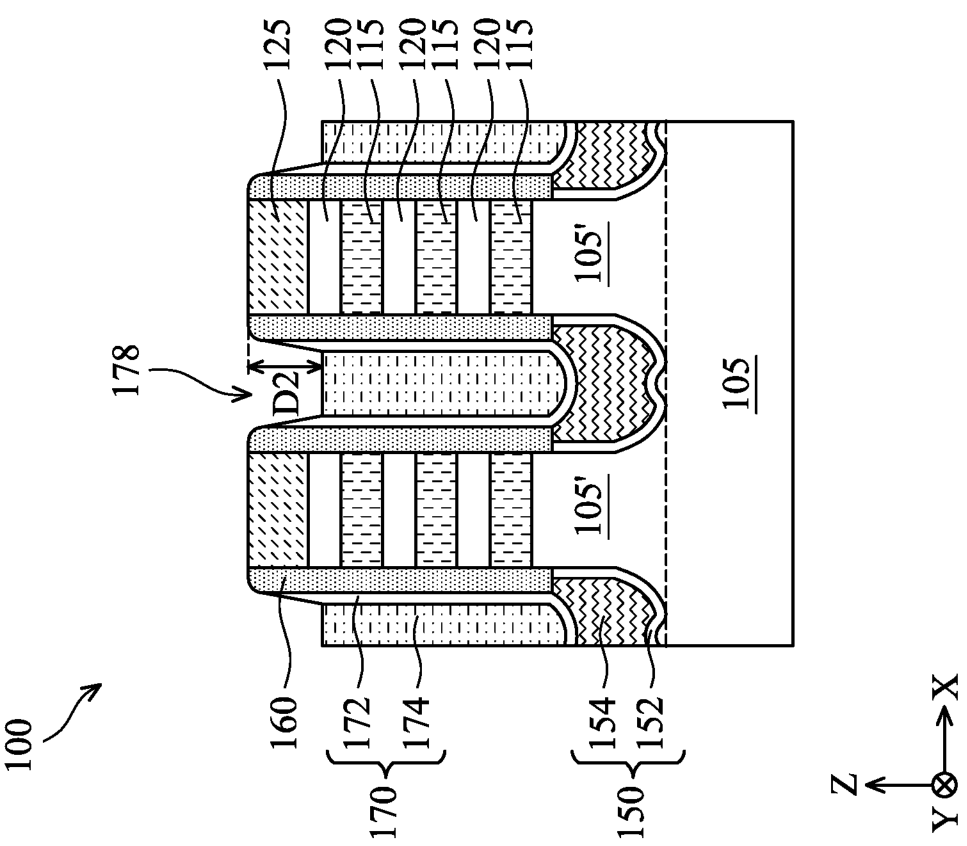
Figure 2I:
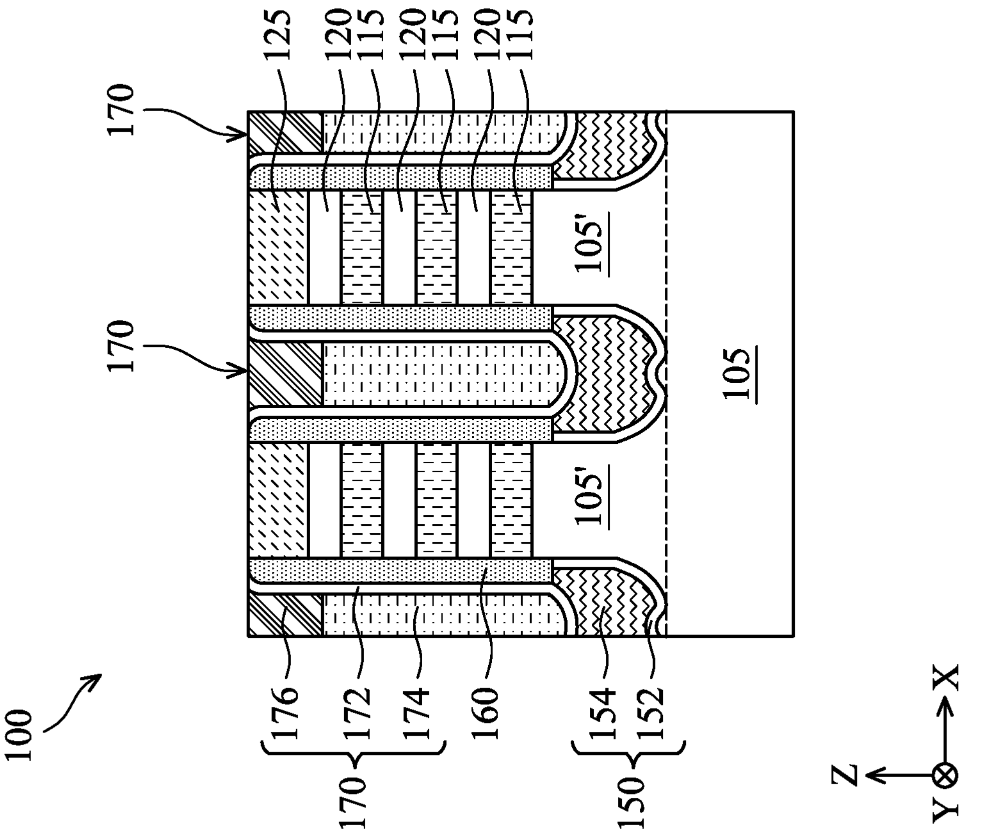

In some embodiments, forming dielectric fins 170 further includes recessing (for example, etching back) oxide layers 174 to a depth D2, thereby forming recesses 178 having sidewalls formed by dielectric liners 172 and/or sacrificial silicon germanium layers 160 and bottoms formed by oxide layers 174 (FIG. 2H); depositing a high-k dielectric material over multigate device 100, where the high-k dielectric material fills recesses 178 (FIG. 2I); and performing a planarization process, such as CMP, to remove portions of the high-k dielectric material that are disposed over top surfaces of semiconductor mask layers 125 (FIG. 2I). In such embodiments, semiconductor mask layers 125 function as planarization (e.g., CMP) stop layers, and the planarization process is performed until reaching and exposing semiconductor mask layers 125. Remainders of the high-k dielectric material form high-k dielectric layers 176 of dielectric fins 170. In some embodiments, top surfaces of dielectric fins 270 (for example, top surfaces of high-k dielectric layers 176, and in some embodiments, top surfaces of dielectric liners 172), top surfaces of semiconductor mask layers 125, and top surfaces of sacrificial silicon germanium layers 160 may be substantially planar. In some embodiments, an etching process recesses oxide layers 174 by selectively removing oxide layers 174 with respect to semiconductor material. For example, the etching process substantially removes oxide layers 174 but does not remove, or does not substantially remove, semiconductor mask layers 125 and/or sacrificial silicon germanium layers 160. In some embodiments, an etchant is selected for the etch process that etches oxide materials at a higher rate than semiconductor materials (i.e., the etchant has a high etch selectivity with respect to oxide layers 174). The high-k dielectric material is formed by ALD, CVD, PVD, HDPCVD, MOCVD, RPCVD, PECVD, LPCVD, ALCVD, APCVD, SACVD, other suitable deposition methods, or combinations thereof.

In some embodiments, the etching process also selectively removes oxide layers 174 with respect to dielectric liners 172, such that the etching process does not remove, or does not substantially remove dielectric liners 172. In some embodiments, such as depicted, the etching process slightly etches dielectric liners 172, and portions of dielectric liners 172 forming sidewalls of recesses 178 have varying thickness, such as tapered thicknesses. In FIG. 2H, dielectric liners 172 remain after the etching back and separate high-k dielectric layers 176 from sacrificial silicon germanium layers 160. In some embodiments, the etching back exposes sacrificial silicon germanium layers 160 (i.e., sidewall portions of dielectric liners 172 are completely removed by the etching process), such that sacrificial silicon germanium layers 160 form a portion and/or an entirety of sidewalls of recesses 178 and high-k dielectric layers 176 physically contact sacrificial silicon germanium layers 160. In some embodiments, an etchant is selected for the etch process that etches oxide materials (i.e., oxide layers 174) at a higher rate than semiconductor materials (i.e., semiconductor mask layers 125 and/or sacrificial silicon germanium layers 160) and carbonitride materials (i.e., dielectric liners 172) (i.e., the etchant has a high etch selectivity with respect to oxide materials). In such embodiments, the etchant may etch carbonitride materials at a higher rate than semiconductor materials.

Figure 2J:
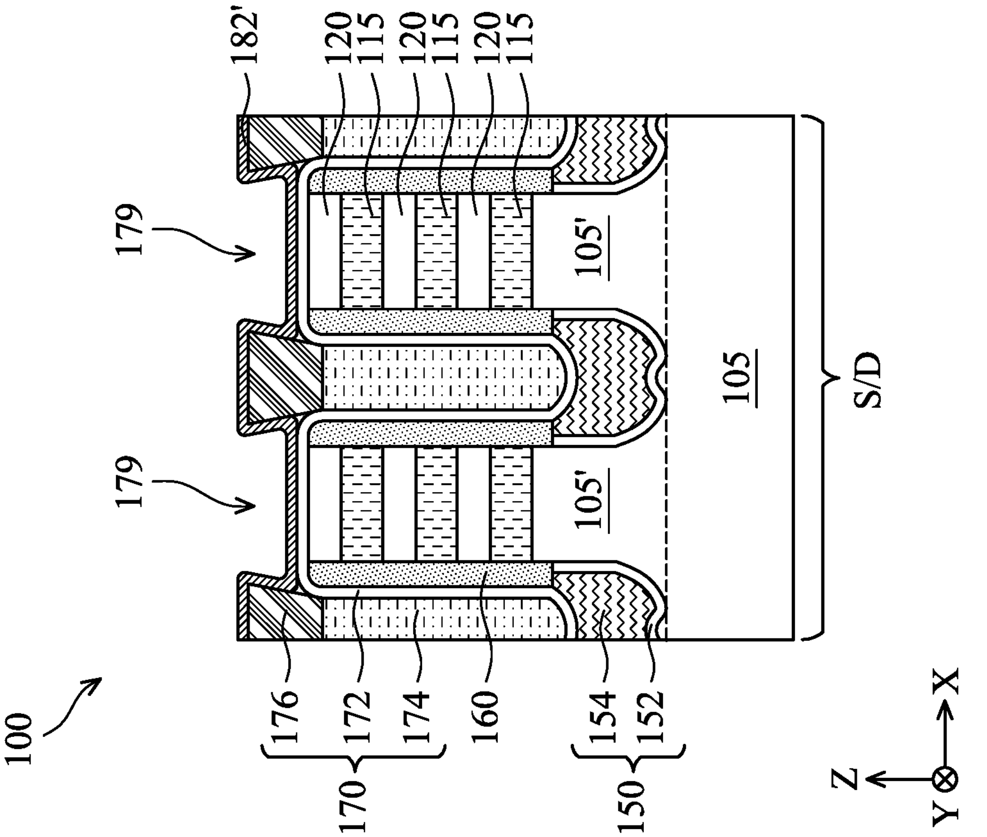
Figure 3B:
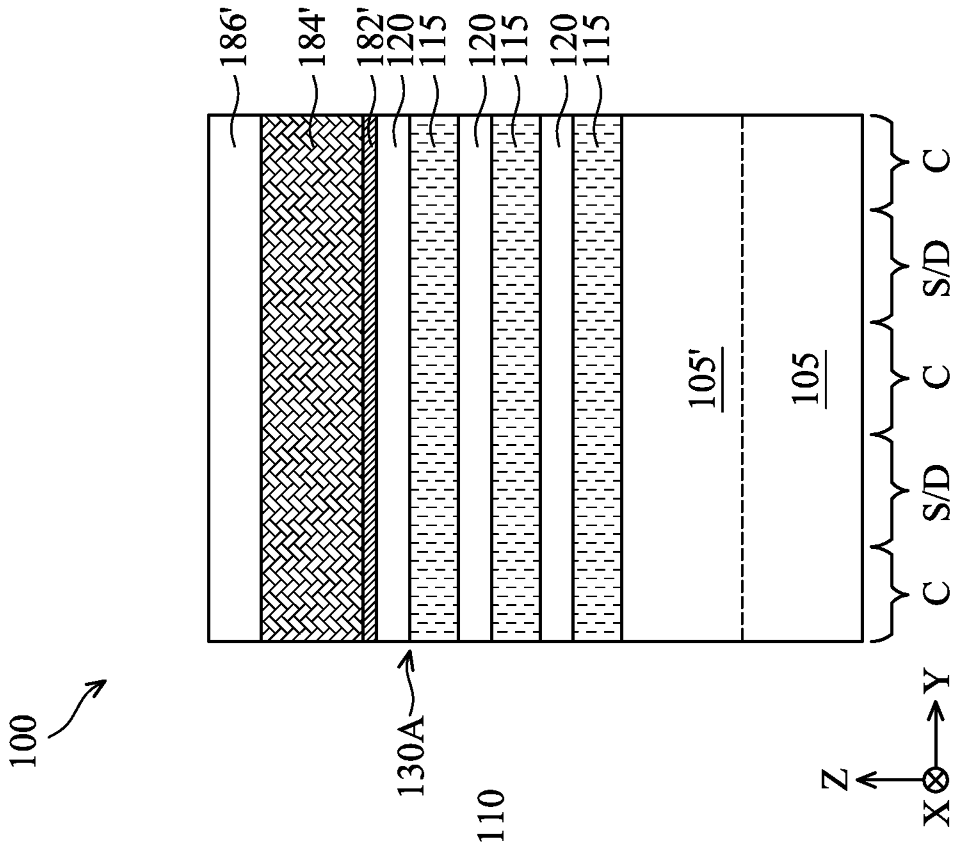
Figure 3A:
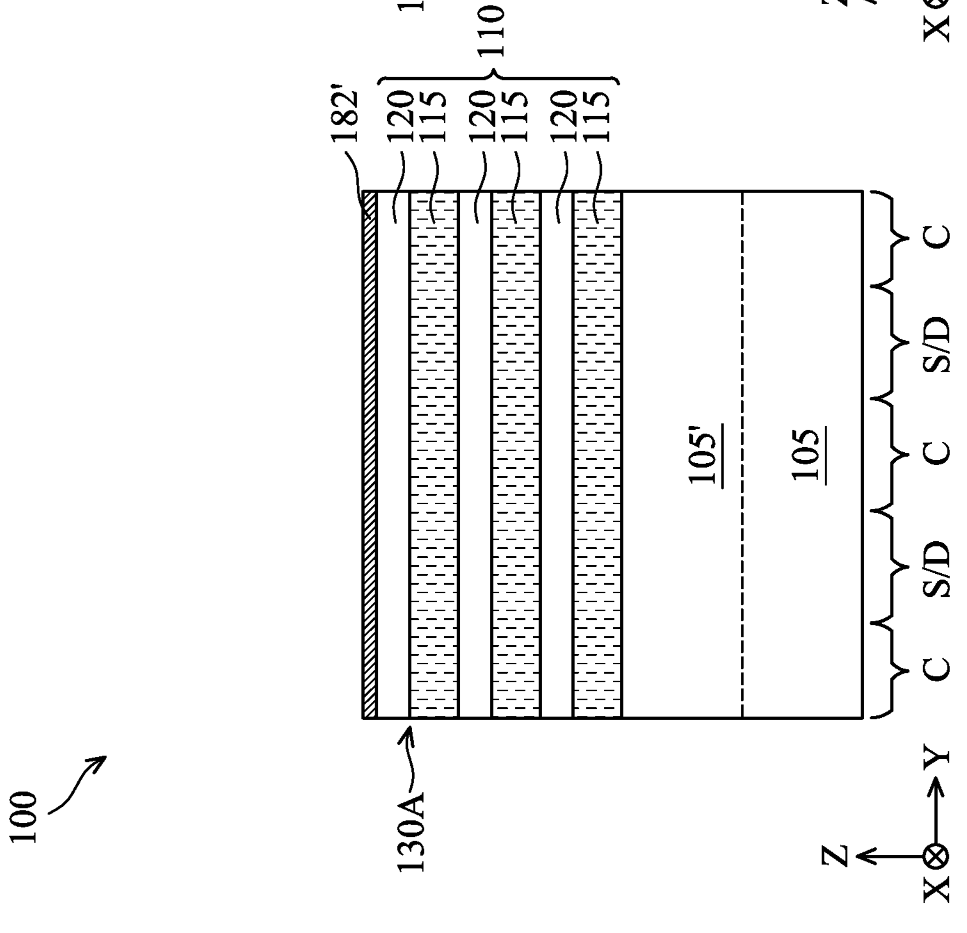

Turning to FIG. 2J and FIG. 3A, an etching process is performed to remove semiconductor mask layers 125 from fin 130A and fin 130B, thereby forming openings 179 that expose semiconductor layer stacks 110 of fin 130A and fin 130B. The etching process further removes portions of sacrificial silicon germanium layers 160 disposed along sidewalls of semiconductor mask layers 125. In FIG. 2J, openings 179 have sidewalls formed by high-k dielectric layers 176 and bottoms formed by semiconductor layer stacks 110 and sacrificial silicon germanium layers 160. The etching process is a dry etch, a wet etch, other suitable etching process, or combinations thereof. In some embodiments, the etching process selectively removes semiconductor mask layers 125 with respect to dielectric fins 170, and in particular, with respect to high-k dielectric layers 176. In other words, the etching process substantially removes semiconductor mask layers 125 and sacrificial silicon germanium layers 160 but does not remove, or does not substantially remove, high-k dielectric layers 176. For example, an etchant is selected for the etch process that etches silicon germanium (e.g., semiconductor mask layers 125 and sacrificial silicon germanium layers 160) at a higher rate than high-k dielectric material (e.g., high-k dielectric layers 176) (i.e., the etchant has a high etch selectivity with respect to silicon germanium). In some embodiments, the etchant is further selected to etch silicon germanium (e.g., semiconductor mask layers 125 and sacrificial silicon germanium layers 160) at a higher rate than silicon (e.g., semiconductor layers 120). In such embodiments, topmost silicon layers 120 may function as etch stop layers. In some embodiments, such as depicted, the etching process further partially or completely removes portions of dielectric liners 172 disposed along sidewalls of high-k dielectric layers 176 (i.e., portions of dielectric liners 172 between sacrificial silicon germanium layers 160 and high-k dielectric layers 176).

Turning to FIGS. 2J-2L, FIGS. 3A-3C, and FIG. 4A, dummy gate stacks 180 are formed over portions of fin 130A, fin 130B, and dielectric fins 170. Each dummy gate stack 180 includes a dummy gate dielectric 182, a dummy gate electrode 194, and a hard mask 186. Dummy gate stacks 180 extend lengthwise in a direction that is different than (e.g., orthogonal to) the lengthwise direction of fin 130A and fin 130B. For example, dummy gate stacks 180 extend substantially parallel to one another along the x-direction, having a length in the x-direction, a width in the y-direction, and a height in the z-direction. Dummy gate stacks 180 are disposed over channel regions (C) of multigate device 100 and between source/drain regions (S/D) of multigate device 100. In the X-Z plane in channel regions of multigate device 100 (FIG. 4A), dummy gate stacks 180 are disposed on top surfaces of fin 130A and fin 130B (in particular, top surfaces of semiconductor layer stacks 110) and wrap high-k dielectric layers 176 of dielectric fins 170. For example, in channel regions, dummy gate stacks 180 are disposed on tops and sidewalls of high-k dielectric layers 176 of dielectric fins 170. It is noted that, because sacrificial silicon germanium layers 160 are formed along sidewalls of fin 130A and fin 130B and dielectric fins 170 are formed before forming dummy gate stacks 180, dummy gate stacks 180 do not wrap and/or cover sidewalls of active regions 155U. In the Y-Z plane (FIG. 3C), dummy gate stacks 180 are disposed over top surfaces of respective channel regions of fin 130A and fin 130B, such that dummy gate stacks 180 interpose respective source/drain regions of fin 130A and fin 130B. In the X-Z plane in source/drain regions of multigate device 100 (FIG. 2L), dummy gate dielectrics 182 of dummy gate stacks 180 are disposed on top surfaces of fin 130A and fin 130B and wrap high-k dielectric layers 176 of dielectric fins 170.

Figure 2K:
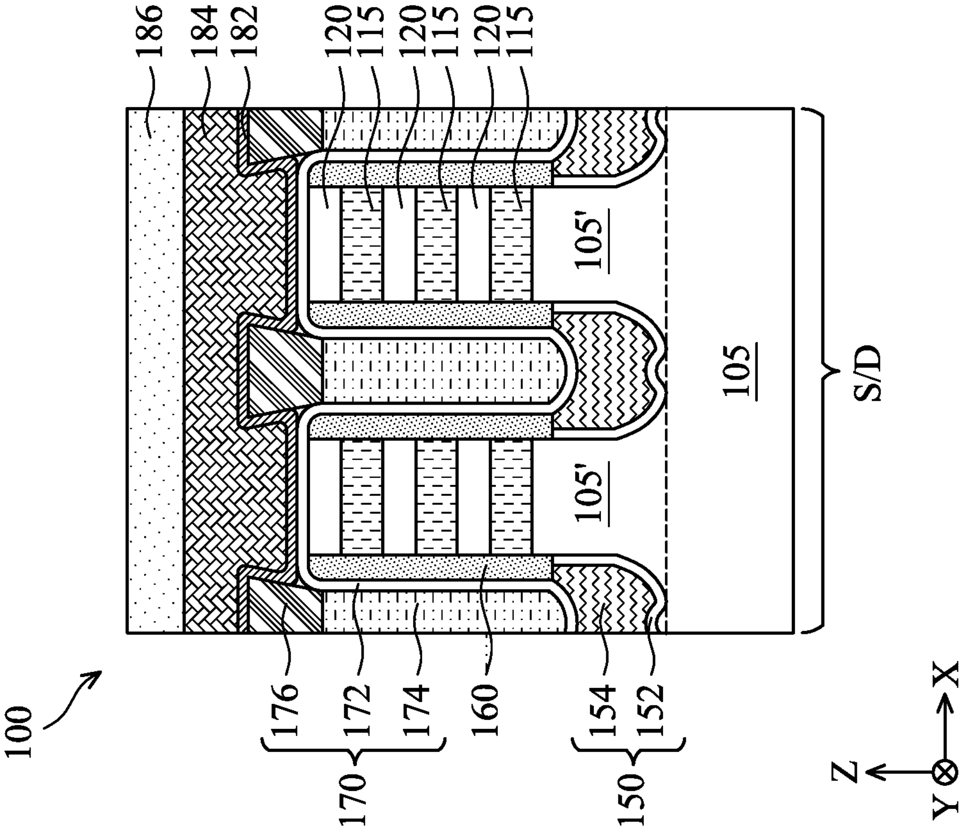

Dummy gate dielectrics 182 include a dielectric material, such as silicon oxide. Dummy gate electrodes 184 include a suitable dummy gate material, such as polysilicon. Hard masks 186 include a suitable hard mask material, such as silicon nitride. In some embodiments, dummy gate stacks 180 include numerous other layers, for example, capping layers, interface layers, diffusion layers, barrier layers, or combinations thereof. Dummy gate stacks 180 are formed by deposition processes, lithography processes, etching processes, other suitable processes, or combinations thereof. For example, a first deposition process forms a dummy gate dielectric layer 182' over multigate device 100 (FIG. 2J and FIG. 3A), a second deposition process forms a dummy gate electrode layer 184' over dummy gate dielectric layer 182' (FIG. 2K and FIG. 3B), and a third deposition process forms a hard mask layer 186' over dummy gate electrode layer 184' (FIG. 2K and FIG. 3B). In FIG. 2J and FIG. 2K, dummy gate dielectric layer 182' and dummy gate electrode layer 184' combine to fill recesses 179, and dummy gate dielectric layer 182' and dummy gate electrode layer 184' wrap high-k dielectric layers 176 of dielectric fins 170. Dummy gate dielectric layer 182' and dummy gate electrode layer 184' also cover and physically contact bottoms of recesses 179, which are formed by tops of fin 130A and fin 130B and tops of sacrificial silicon germanium layers 160 disposed along sidewalls of fin 130A and fin 130B. In the depicted embodiment, dielectric liners 172 disposed along sidewalls of high-k dielectric layers 176 are removed during etching of semiconductor mask layers 125. Accordingly, dummy gate dielectric layer 182' physically contacts tops of high-k dielectric layers 176 and sidewalls of high-k dielectric layers 176. The first, second, and third deposition processes include CVD, PVD, ALD, RPCVD, PECVD, HDPCVD, FCVD, HARP, LPCVD, ALCVD, APCVD, SACVD, MOCVD, plating, other suitable methods, or combinations thereof.

Figure 2L:
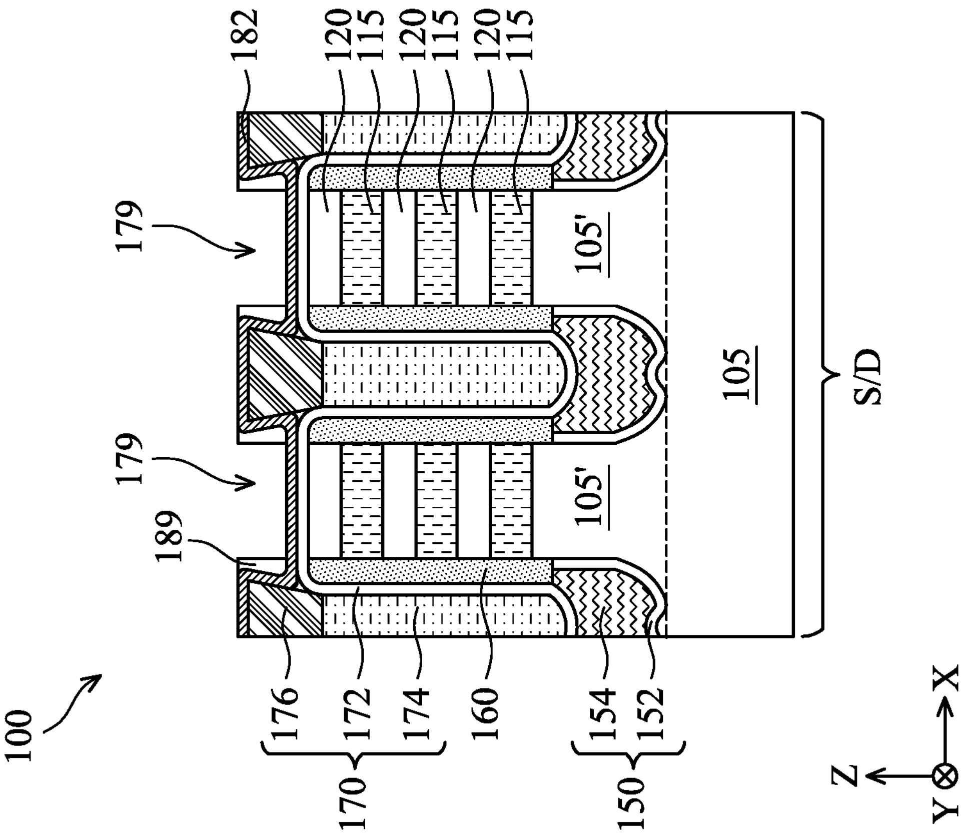
Figure 2N:
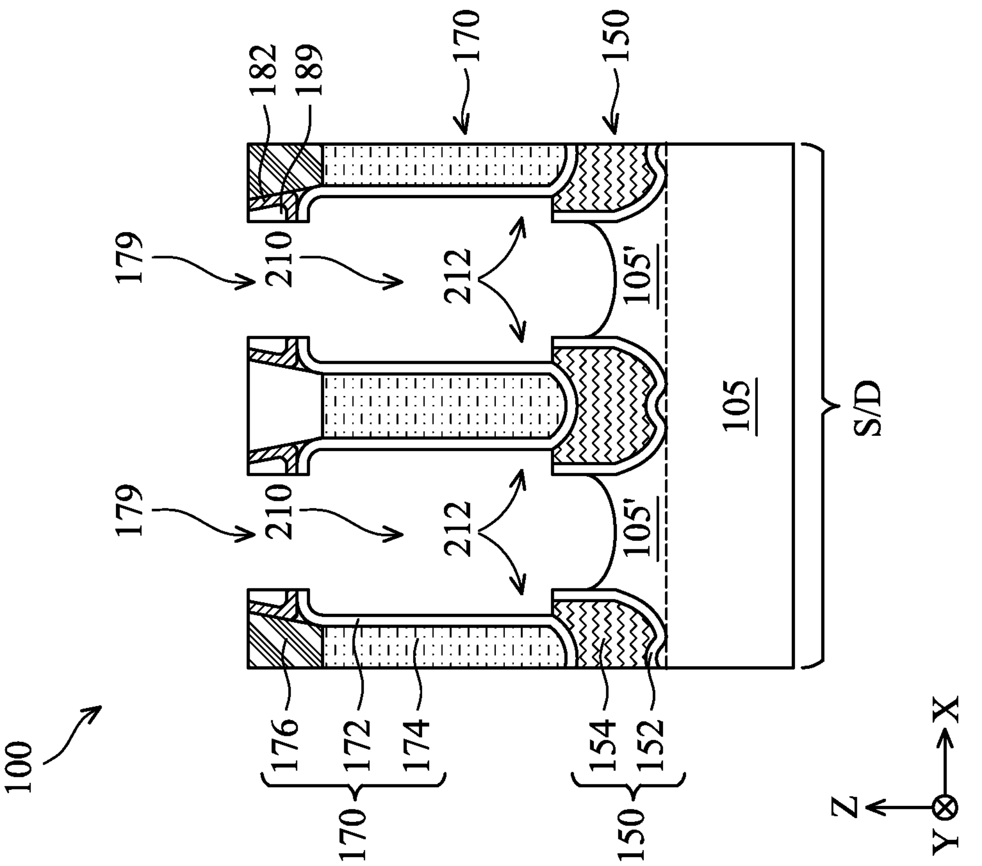
Figure 3D:
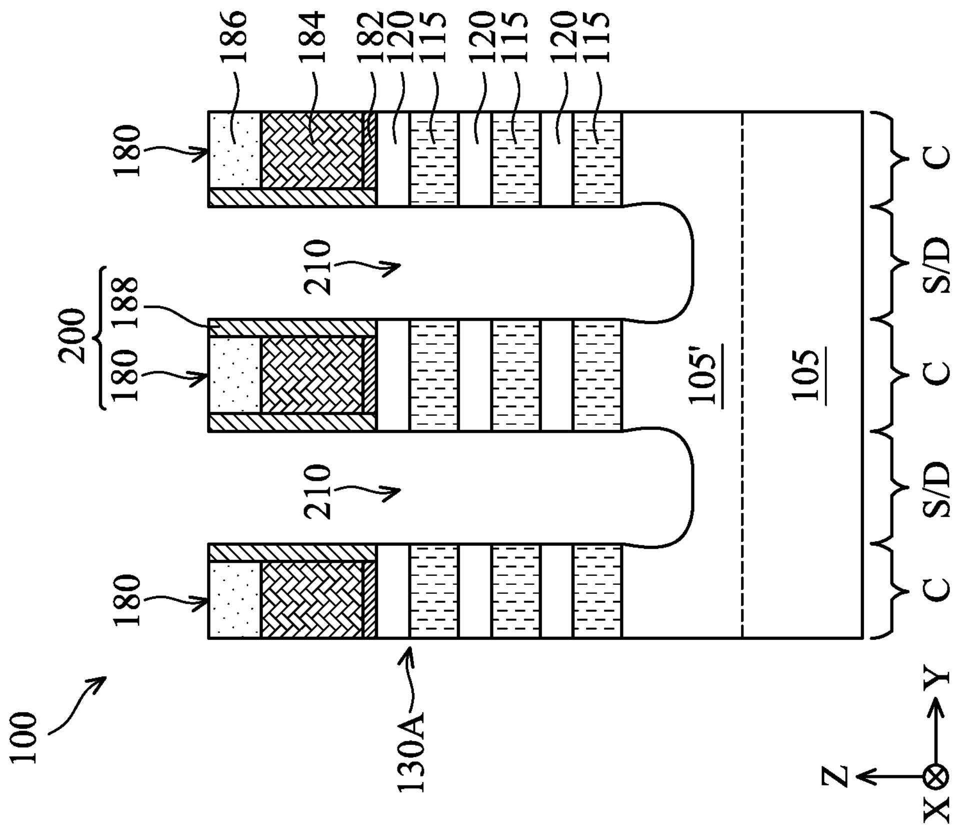
Figure 3C:
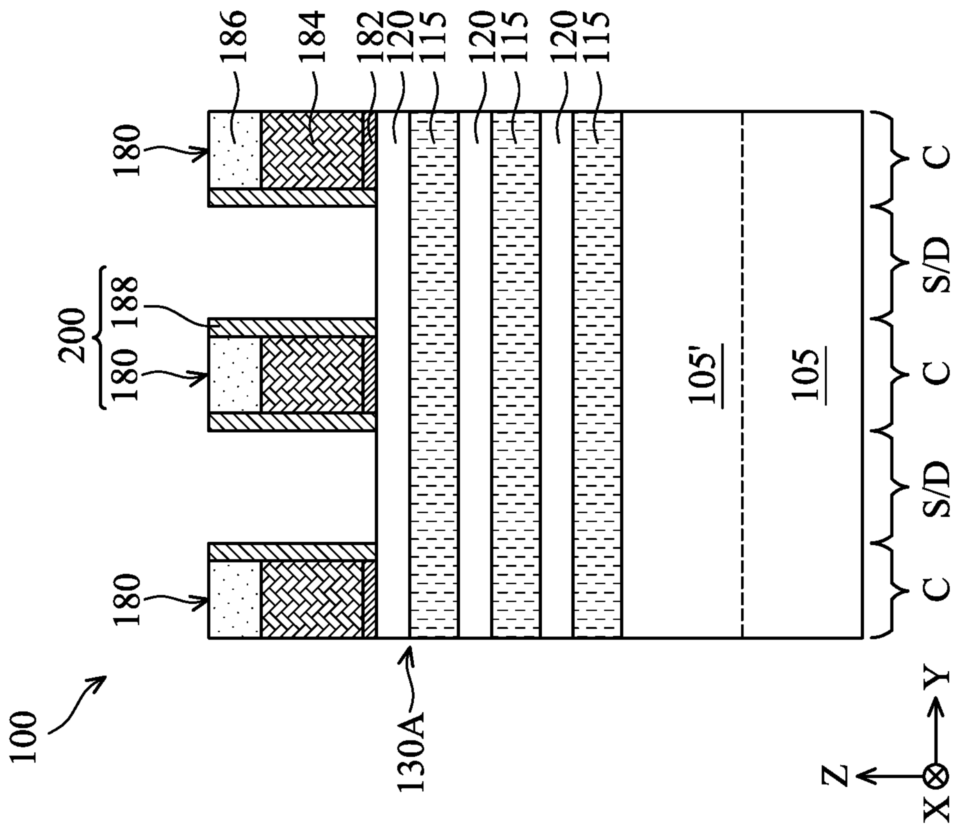
Figure 4B:
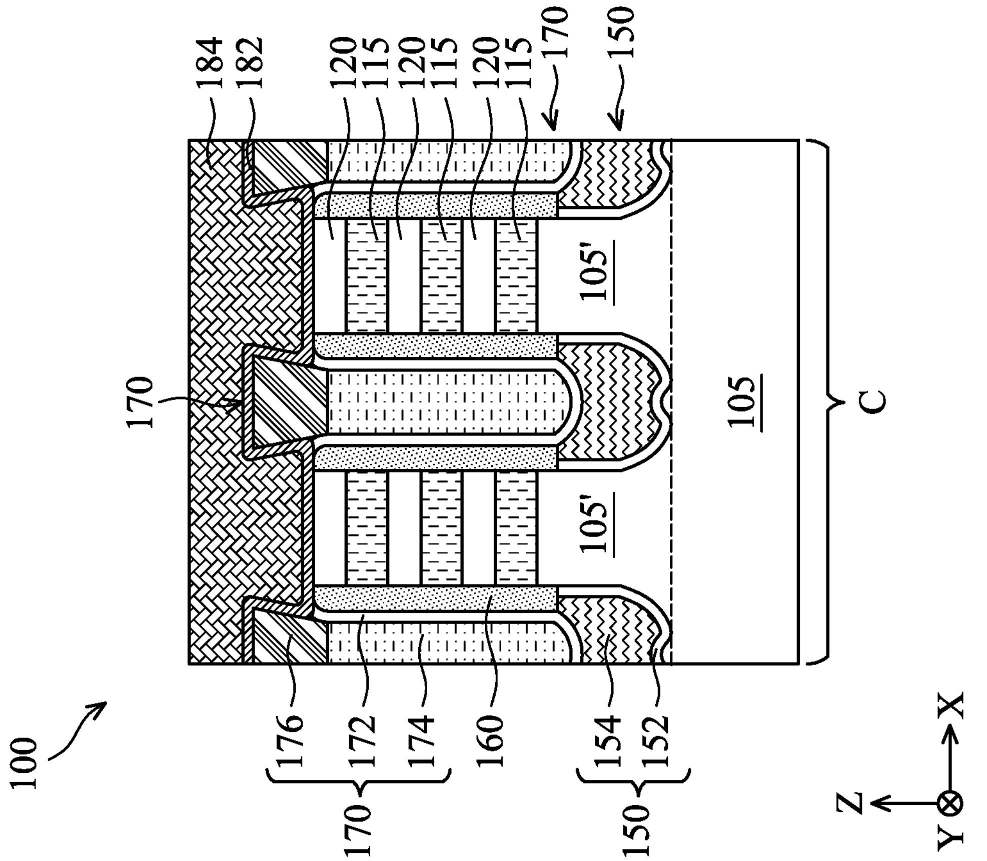
Figure 4A:
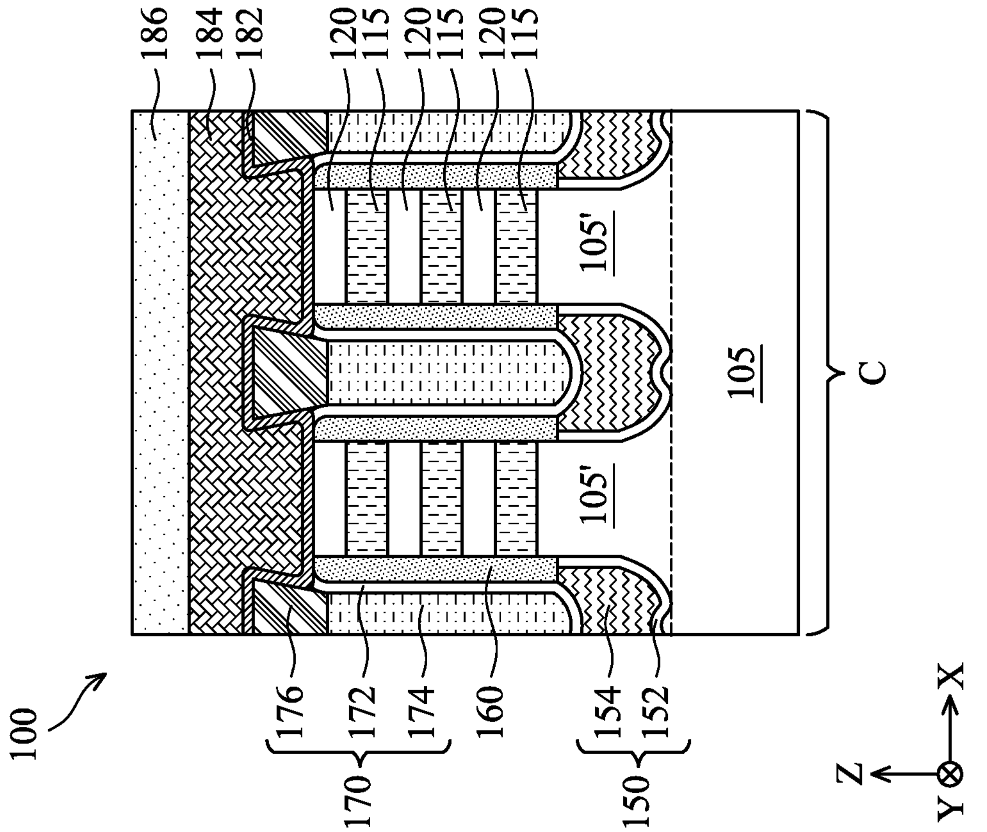

In FIG. 2L, FIG. 3C, and FIG. 4A, a lithography patterning process and an etching process, such as those described herein, is performed to pattern hard mask layer 186', dummy gate electrode layer 184', and dummy gate dielectric layer 182'. For example, hard mask layer 186' and dummy gate electrode layer 184' are removed from source/drain regions of multigate device 100, thereby forming dummy gate stacks 180 having dummy gate dielectric 182, dummy gate electrode 184, and hard mask 186 in channel regions of fin 130A and fin 130B, such as depicted in FIG. 3C and FIG. 4A. In some embodiments, dummy gate dielectric layer 182' is not removed by the lithography patterning process and the etching process from source/drain regions of multigate device 100. In such embodiments, dummy gate dielectric 182 spans channel regions and source/drain regions, such as depicted in FIG. 2L, FIG. 3C, and FIG. 4A. In some embodiments, dummy gate dielectric layer 182' is removed by the lithography patterning process and the etching process from source/drain regions of multigate device 100.

In FIG. 2L, FIG. 3C, and FIG. 4A, gate spacers 188 are formed adjacent to (i.e., along sidewalls of) dummy gate stacks 180, thereby forming gate structures 200, and fin spacers 189 are formed adjacent to (i.e., along sidewalls of) high-k dielectric layers 176 of dielectric fins 170. In the depicted embodiment, fin spacers 189 partially fill recesses 179, and dummy gate dielectrics 182 are between fin spacers 189 and high-k dielectric layers 176. Gate spacers 188 and fin spacers 189 are formed by any suitable process and include a dielectric material, which can include silicon, oxygen, carbon, nitrogen, other suitable material, or combinations thereof (e.g., silicon oxide, silicon nitride, silicon oxynitride, silicon carbide, silicon carbon nitride, silicon oxycarbide, silicon oxycarbonitride, or combinations thereof). For example, a dielectric layer including silicon and nitrogen, such as a silicon nitride layer, is deposited over multigate device 100 and etched to form gate spacers 188 and fin spacers 189. In some embodiments, gate spacers 188 and/or fin spacers 189 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, main spacers, or combinations thereof, are formed adjacent to dummy gate stacks 180. In such embodiments, the various sets of spacers can include different materials, for example, having different etch rates. For example, a silicon oxide layer can be deposited and etched to form a first spacer set of gate spacers 188 adjacent to sidewalls of dummy gate stacks 180, and a silicon nitride layer can be deposited and etched to form a second spacer set of gate spacers 188 adjacent to the first spacer set.

Figure 2M:
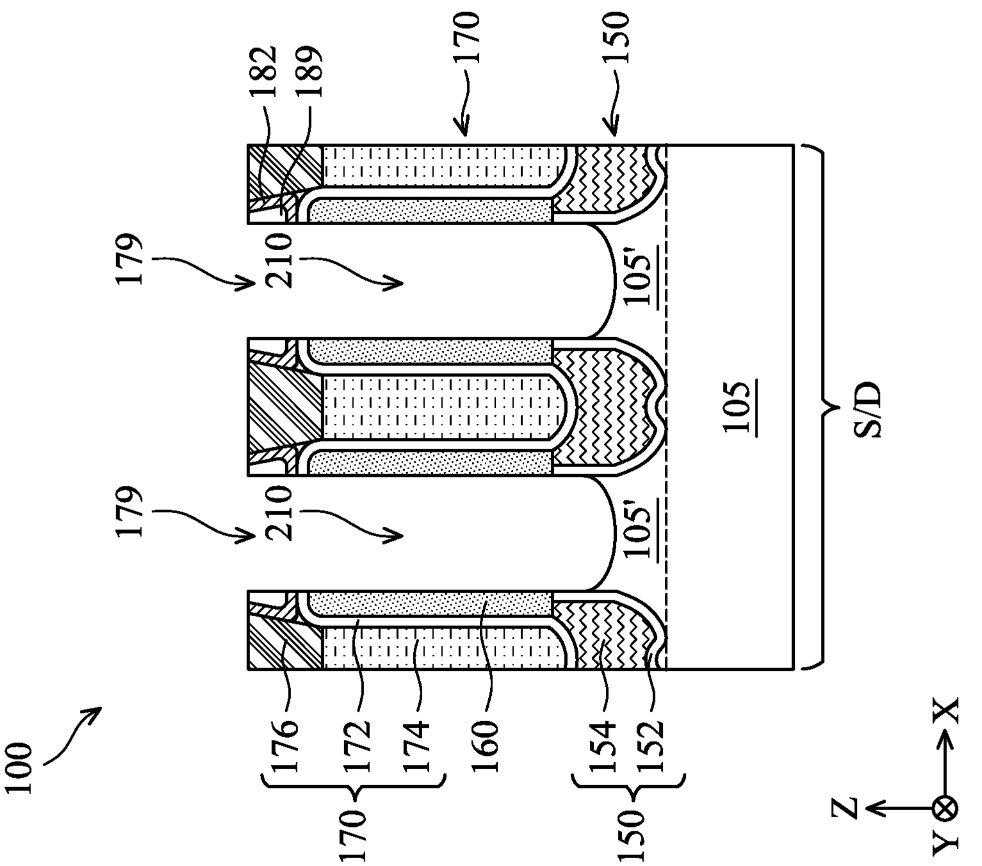
Figure 2P:
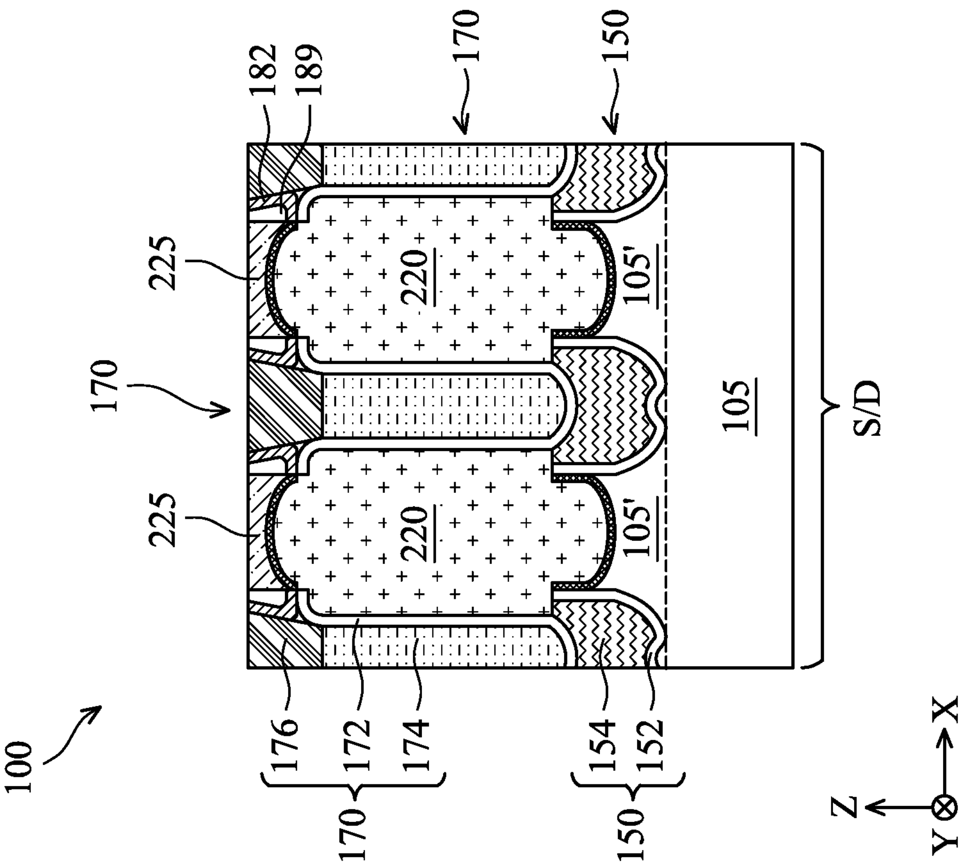

Turning to FIG. 2M and FIG. 3D, processing includes forming source/drain recesses 210 in source/drain regions of multigate device 100. In the depicted embodiment, an etching process completely removes semiconductor layer stacks 110 and removes some, but not all, of semiconductor mesas 105' in source/drain regions of multigate device 100. In the X-Z plane (FIG. 2M), each source/drain recess 210 has a bottom formed by semiconductor mesas 105' and sidewalls formed by fin spacers 189, sacrificial silicon germanium layers 160, and dielectric liners 152 of isolation features 150. In the Y-Z plane (FIG. 3D), each source/drain recess 210 has a bottom formed by semiconductor mesas 105' and sidewalls formed by remainders of semiconductor layer stacks 110 (e.g., semiconductor layers 115 and semiconductor layers 120) in channel regions of multigate device 100. In such embodiments, source/drain recesses 210 have bottoms that are below bottommost surfaces of dielectric fins 170 and above bottommost surfaces of isolation features 150 (i.e., isolation features 150 extend deeper into semiconductor mesas 105' than source/drain recesses 210). Bottoms of source/drain recesses 150 are also below top surfaces of isolation features 250. In some embodiments, the etching process removes some, but not all, of semiconductor layer stacks 110, such that source/drain recesses 210 have bottoms formed by respective semiconductor layers 115 or semiconductor layers 120. In some embodiments, the etching process removes semiconductor layer stacks 110 and exposes semiconductor mesas 105' (i.e., source/drain recesses 210 do not extend into semiconductor mesas 105'). The etching process can include a dry etch, a wet etch, other suitable etching process, or combinations thereof. In some embodiments, the etching process is a multi-step etch process. For example, the etching process may alternate etchants to separately and alternately remove semiconductor layers 115, semiconductor layers 120, dummy gate dielectrics 182, or combinations thereof. In some embodiments, parameters of the etching process are configured to selectively etch semiconductor layer stacks 110 with minimal (to no) etching of gate structures 200 (i.e., hard masks 186 and gate spacers 188) and/or dielectric fins 170 (i.e., high-k dielectric layers 176). In some embodiments, a lithography process, such as those described herein, is performed to form a patterned mask layer that covers gate structures 200 and/or dielectric fins 170, and the etching process uses the patterned mask layer as an etch mask.

Figure 3F:
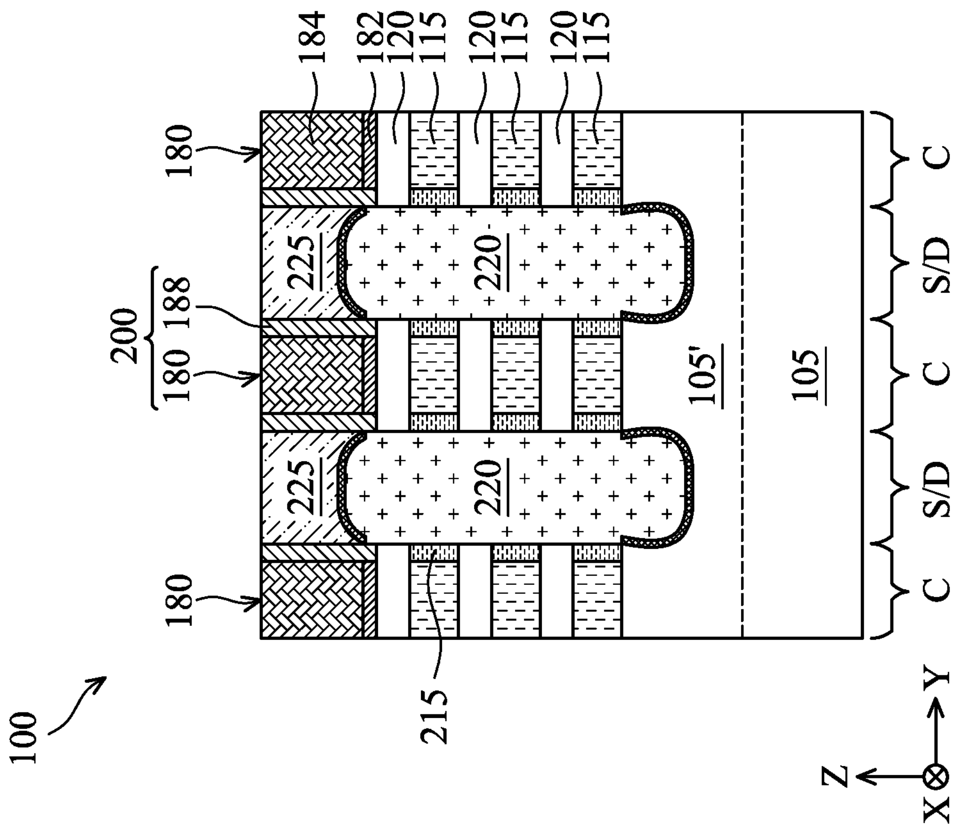
Figure 3E:
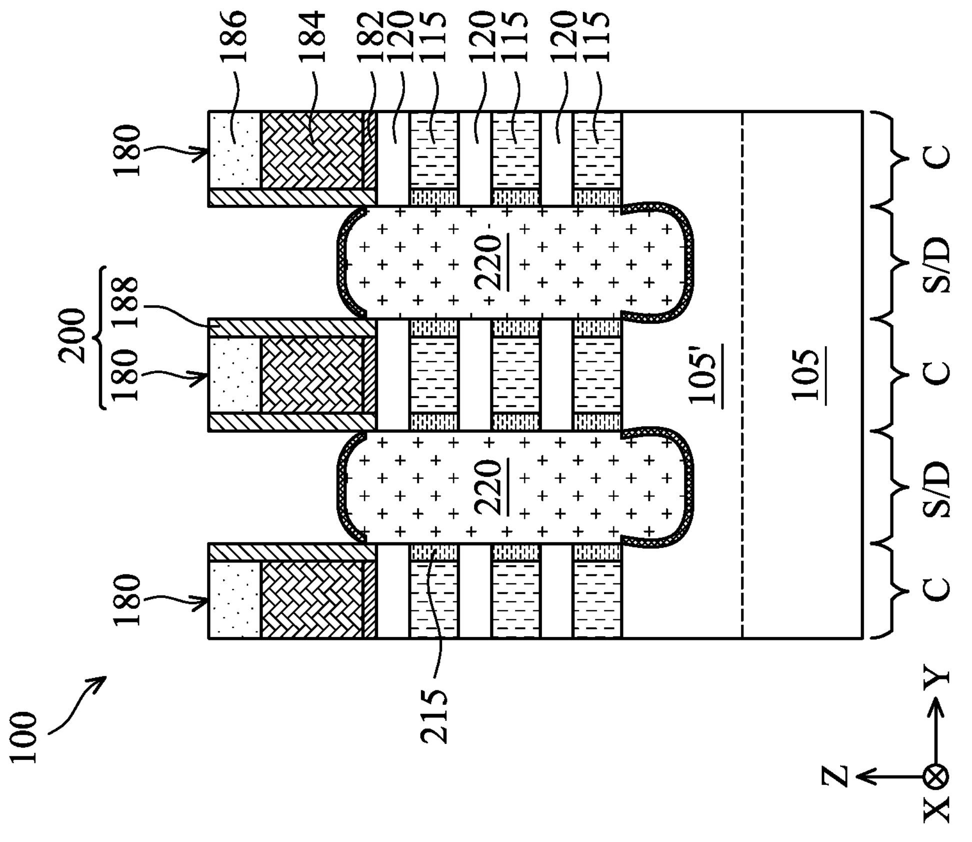

Turning to FIG. 2N and FIG. 3E, source/drain recess extensions 212 of source/drain recesses 210 are formed by removing sacrificial silicon germanium layers 160 in source/drain regions of multigate device 100 (FIG. 2N), and inner spacers 215 are formed under gate structures 200 (e.g., under gate spacers 188) (FIG. 3E). Source/drain recess extensions 212 increase widths of source/drain recesses 210 along the x-direction and expose isolation features 150 and dielectric fins 170. In such embodiments, widths of upper portions of source/drain recesses 210 are greater than widths of lower portions of source/drain recesses 210. In some embodiments, widths of upper portions of source/drain recesses 210 are greater than widths of recesses 179. Source/drain recess extensions 212 expose dielectric liners 152, oxide layers 154, and dielectric liners 172. Source/drain recess extensions 212 also expose dummy gate dielectrics 182 and/or fin spacers 189. Inner spacers 215 separate semiconductor layers 120 from one another and bottommost semiconductor layers 120 from semiconductor mesas 105', and inner spacers 215 abut sidewalls of semiconductor layers 115 under dummy gate stacks 180.

In some embodiments, forming source/drain recess extensions 212 and inner spacers 215 includes a first etching process, a deposition process, and a second etching process. The first etching process selectively etches semiconductor layers 115 and silicon germanium sacrificial layers 160 exposed by source/drain recesses 210 with minimal (to no) etching of semiconductor layers 120, semiconductor mesas 105', isolation features 150, dielectric fins 170, fin spacers 189, gate structures 200, or combinations thereof. The first etching process thus forms gaps between semiconductor layers 120, forms gaps between semiconductor mesas 105' and semiconductor layers 120, and forms source/drain recess extensions 212 (i.e., laterally extend source/drain recesses 210). The gaps are under gate spacers 188, such that portions of semiconductor layers 120 are suspended under gate spacers 188 and separated from one another by the gaps. In some embodiments, the gaps extend at least partially under dummy gate stacks 180. The first etching process is configured to laterally etch (e.g., along the x-direction and the y-direction) semiconductor layers 115 and sacrificial silicon germanium layers 160, thereby reducing lengths of semiconductor layers 115 along the y-direction and increasing widths of source/drain recesses 210 along the x-direction. The first etching process is a dry etch, a wet etch, other suitable etching process, or combinations thereof. In some embodiments, the first etching process is an anisotropic etch process having a horizontal etch rate that is greater than a vertical etch rate (in some embodiments, the vertical etch rate equals zero), such that the anisotropic etch process removes material in substantially the horizontal direction (here, the x-direction and the y-direction) with minimal (to no) material removal in the vertical direction (here, the z-direction).

The deposition process forms a spacer layer over gate structures 200 and over features forming source/drain recesses 210 (e.g., semiconductor mesas 105', semiconductor layers 115, semiconductor layers 120, isolation features 150, dielectric fins 170, fin spacers 189, or combinations thereof). The deposition process can include CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills source/drain recesses 210, and the deposition process is configured to ensure that the spacer layer fills the gaps between semiconductor layers 120. The spacer layer (and thus inner spacers 215) includes a material that is different than a material of semiconductor layers 120, a material of semiconductor mesas 105', a material of isolation features 150, a material of dielectric fins 170, a material of fin spacers 189, a material of gate spacers 188, a material of hard masks 186, or combinations thereof to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, silicon oxycarbonitride, or combinations thereof). In some embodiments, the spacer layer includes a low-k dielectric material, such as those described herein. In some embodiments, the dielectric material includes dopants (e.g., p-type dopants and/or n-type dopants) and the spacer layer is a doped dielectric layer.

The second etching process then selectively etches the spacer layer to form inner spacers 215, which fill the gaps, with minimal (to no) etching of semiconductor layers 120, semiconductor mesas 105', dielectric liners 152, oxide layers 154, dielectric liners 172, fin spacers 189, gate structures 200, or combinations thereof. The second etching process is a dry etch, a wet etch, other suitable etching process, or combinations thereof.

Figure 2O:
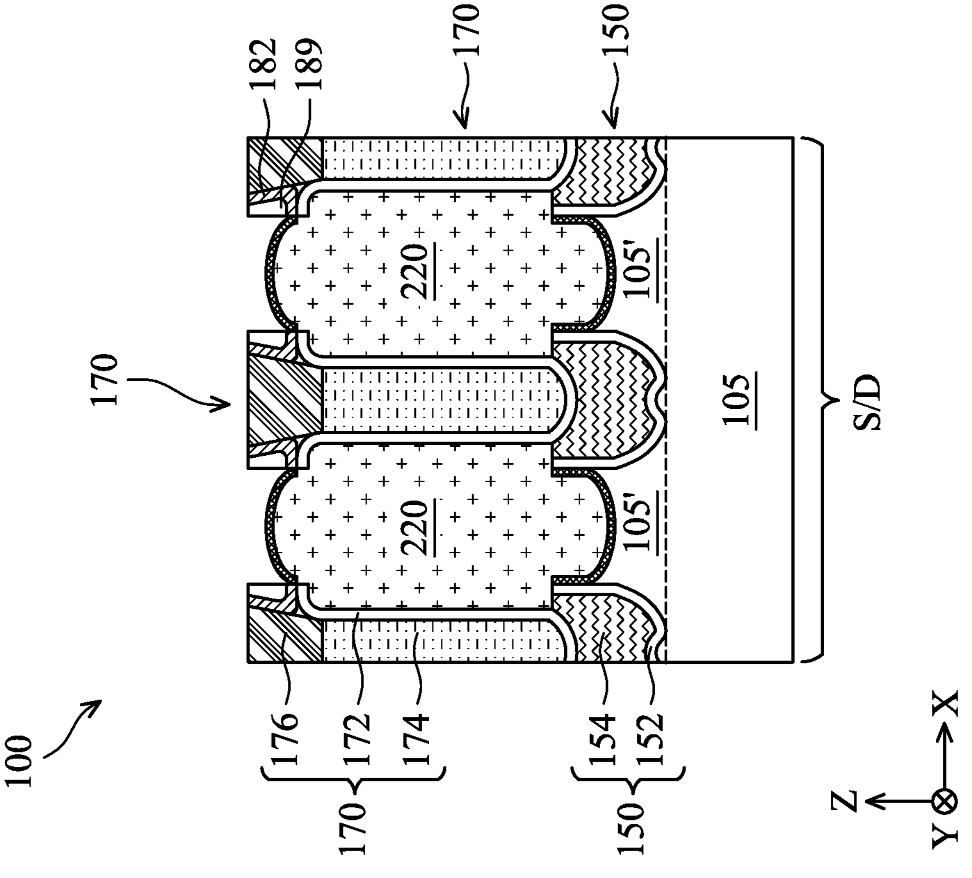

Turning to FIG. 2O and FIG. 3E, epitaxial source/drain features 220 are formed in and fill source/drain recesses 210, including source/drain recess extensions 212. For example, a semiconductor material is epitaxially grown from semiconductor mesas 105' and semiconductor layers 120 exposed by source/drain recesses 210. In the X-Z plane (FIG. 2O), epitaxial source/drain features 220 physically contact semiconductor mesas 105', isolation features 150, and dielectric fins 170. Because source/drain recesses 210 extend a depth into semiconductor mesas 105', epitaxial source/drain features 220 extend below bottoms of dielectric fins 170. For example, bottommost surfaces of epitaxial source/drain features 220 are lower than bottommost surfaces of dielectric fins 170, and in the depicted embodiment, lower than top surfaces of isolation features 150. Further, portions of epitaxial source/drain features 220 that fill source/drain recess extensions 212 extend laterally (here, along the x-direction) over tops of isolation features 150 to dielectric fins 170 and extend vertically (here, along the y-direction) from fin spacers 189 to isolation features 150. In the depicted embodiment, portions of epitaxial source/drain features 220 that fill source/drain recess extensions 212 physically contact dielectric liners 152 of isolation features 150, oxide layers 154 of isolation features 150, dielectric liners 172 of dielectric fins 170, and dummy gate dielectrics 182 (which are disposed between fin spacers 189 and epitaxial source/drain features 220). In the Y-Z plane (FIG. 3E), epitaxial source/drain features 220 physically contact semiconductor mesas 105', semiconductor layers 120, and inner spacers 215. In some embodiments, such as depicted (FIG. 2O), epitaxial source/drain features 220 completely fill source/drain recesses 210 and extend into and partially fill recesses 179. In such embodiments, top surfaces of epitaxial source/drain features 220 are lower than topmost surfaces of dielectric fins 170. For example, top surfaces of epitaxial source/drain features 220 are lower than top surfaces of high-k dielectric layers 176 of dielectric fins 170. In some embodiments, epitaxial source/drain features 220 extending into recesses 179 physically contact fin spacers 189. In some embodiments, top surfaces of epitaxial source/drain features 220 are at a substantially same height or higher than topmost surfaces of dielectric fins 170. In some embodiments, epitaxial source/drain features 220 extend above topmost semiconductor layers 120 and between adjacent gate structures 200 (FIG. 3E). In such embodiments, epitaxial source/drain features 220 may physically contact gate spacers 188. In some embodiments, such as depicted, top surfaces of dielectric layers 174 of dielectric fins 170 (or, put another way, higher than interfaces between high-k dielectric layers 176 and dielectric layers 174) are lower than top surfaces of epitaxial source/drain features 220 and top surfaces of topmost semiconductor layers 120 of semiconductor layer stacks 110.

An epitaxy process can use CVD deposition techniques (for example, RPCVD, LPCVD, VPE, UHV-CVD, or combinations thereof), MBE, other suitable epitaxial growth processes, or combinations thereof. The epitaxy process can use gaseous precursors and/or liquid precursors, which interact with the composition of semiconductor mesas 105' and/or semiconductor layers 120. Epitaxial source/drain features 220 are doped with n-type dopants and/or p-type dopants. In some embodiments (for example, for n-type transistors), epitaxial source/drain features 220 include silicon, which can be doped with carbon, phosphorous, arsenic, other n-type dopant, or combinations thereof (for example, Si:C epitaxial source/drain features, Si:P epitaxial source/drain features, or Si:C:P epitaxial source/drain features). In some embodiments (for example, for p-type transistors), epitaxial source/drain features 220 include silicon germanium or germanium, which can be doped with boron, other p-type dopant, or combinations thereof (for example, Si:Ge:B epitaxial source/drain features). In some embodiments, epitaxial source/drain features 220 include more than one epitaxial semiconductor layer, where the epitaxial semiconductor layers can include the same or different materials and/or the same or different dopant concentrations. As an example, epitaxial source/drain features 220 may include a first epitaxial layer, a second epitaxial layer, and a third epitaxial layer, where the first epitaxial layer is between semiconductor mesas 105' and the second epitaxial layer, the second epitaxial layer is between the first epitaxial layer and the third epitaxial layer, and the third epitaxial layer is a cap layer. In some embodiments, epitaxial source/drain features 220 include materials and/or dopants that achieve desired tensile stress and/or compressive stress in respective channel regions of n-type transistors and/or p-type transistors. In some embodiments, epitaxial source/drain features 220 are doped during deposition by adding impurities to a source material of the epitaxy process (i.e., in-situ). In some embodiments, epitaxial source/drain features 220 are doped by an ion implantation process subsequent to a deposition process. In some embodiments, annealing processes (e.g., rapid thermal annealing and/or laser annealing) are performed to activate dopants in epitaxial source/drain features 220 and/or other source/drain regions (for example, heavily doped source/drain (HDD) regions and/or lightly doped source/drain (LDD) regions). In some embodiments, epitaxial source/drain features 220 are formed in separate processing sequences, for example, by masking a p-type transistor region when forming epitaxial source/drain features for n-type transistors and masking an n-type transistor region when forming epitaxial source/drain features for p-type transistors.

Turning to FIG. 2P, FIG. 3F, and FIG. 4B, a dielectric layer 225 is formed over multigate device 100. Dielectric layer 225 is disposed over epitaxial source/drain features 220. In the X-Z plane (FIG. 2P), dielectric layer 225 fills remainders of recesses 179 and extends between high-k dielectric layers 176 of adjacent dielectric fins 170. In the Y-Z plane (FIG. 3F), dielectric layer 225 fills spaces between adjacent gate structures 200 and extends between gate spacers 188 of adjacent gate structures 200. In some embodiments, forming dielectric layer 225 includes depositing a contact etch stop layer (CESL) over multigate device 100, depositing an interlayer dielectric (ILD) layer over the CESL, and performing a CMP and/or other planarization process until reaching (exposing) top portions (or top surfaces) of dummy gate stacks 180. In the depicted embodiment, the planarization process removes hard masks 186 of dummy gate stacks 180 to expose underlying dummy gate electrodes 184, such as polysilicon gate electrodes. The CESL and the ILD layer are formed by CVD, PVD, ALD, HDPCVD, HARP, FCVD, MOCVD, RPCVD, PECVD, LPCVD, ALCVD, APCVD, other suitable methods, or combinations thereof. In some embodiments, the ILD layer is formed by FCVD, HARP, HDPCVD, or combinations thereof. The ILD layer includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, the ILD layer includes a dielectric material having a dielectric constant that is less than a dielectric constant of silicon dioxide. In some embodiments, the ILD layer includes a dielectric material having a dielectric constant that is less than about 2.5 (i.e., an extreme low-k (ELK) dielectric material), such as $SiO_2$ (for example, porous silicon oxide), silicon carbide, carbon-doped oxide (for example, a SiCOH-based material (having, for example, Si—$CH_3$ bonds)), or combinations thereof, each of which is tuned/configured to exhibit a dielectric constant less than about 2.5. The CESL includes a material different than the ILD layer, such as a dielectric material that is different than the dielectric material of the ILD layer. For example, where the ILD layer includes a low-k dielectric material, such as porous silicon oxide, the CESL can include silicon and nitrogen, such as silicon nitride, silicon carbonitride, or silicon oxycarbonitride. The CESL and/or the ILD layer can include a multilayer structure having multiple dielectric materials.

Figure 2R:
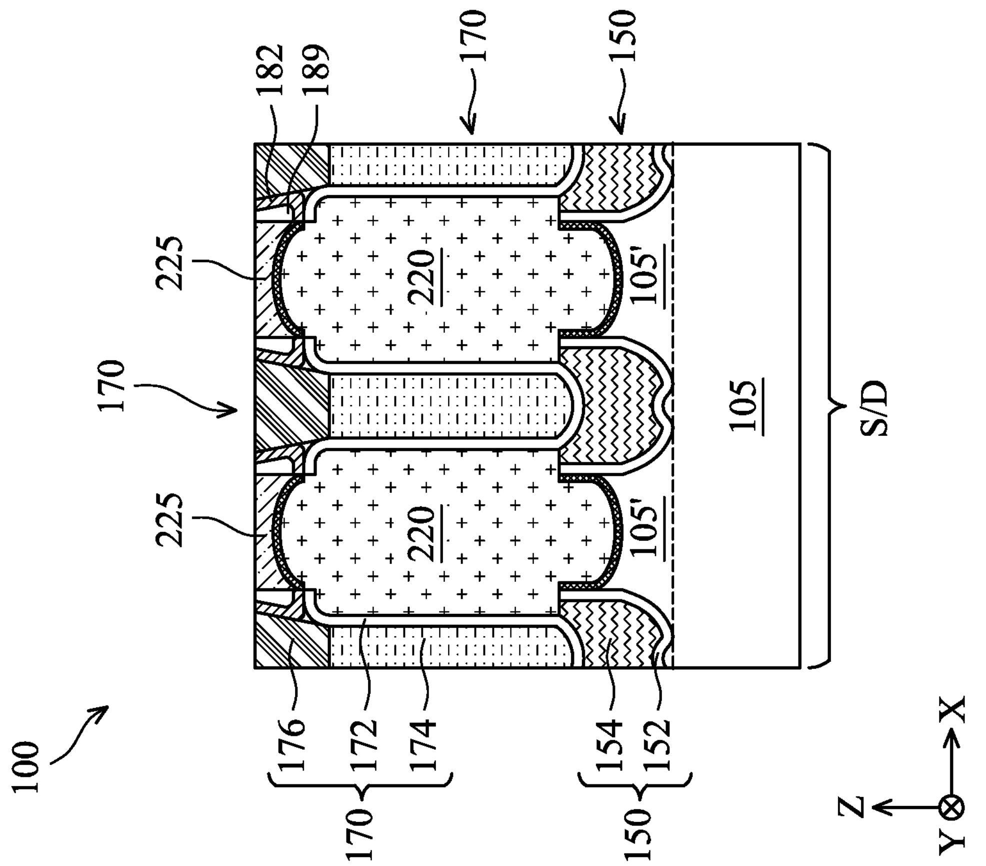
Figure 2Q:
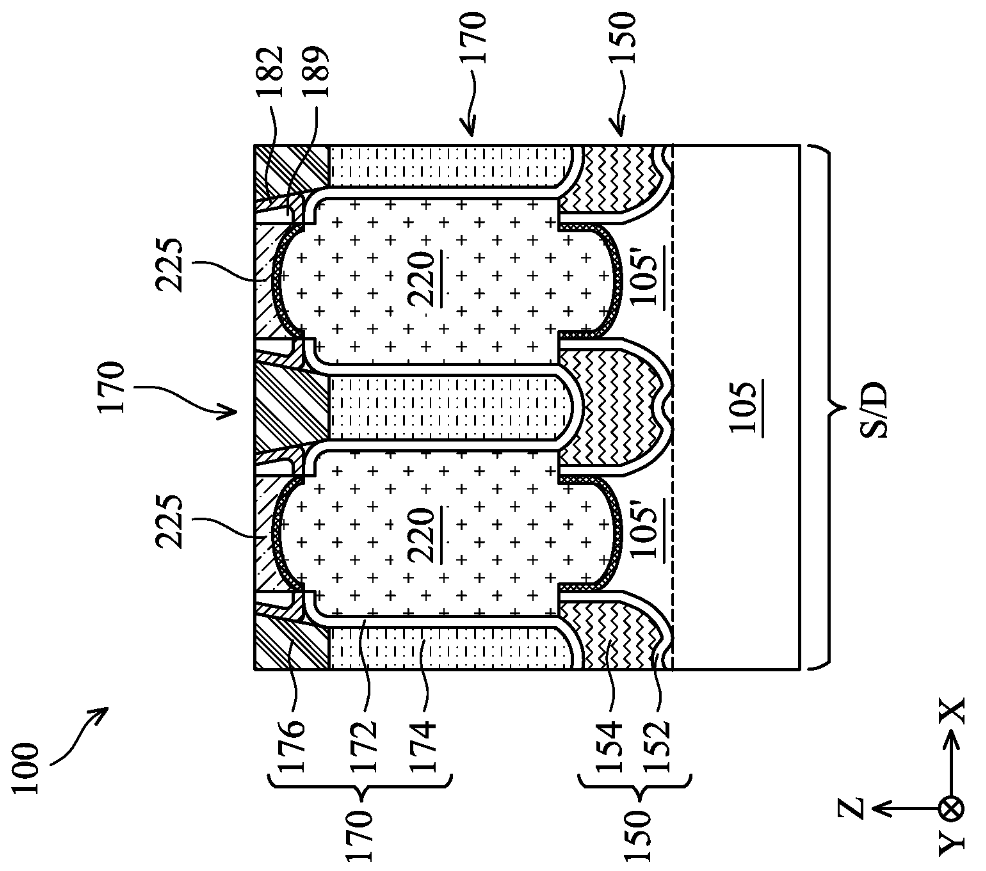
Figure 3H:
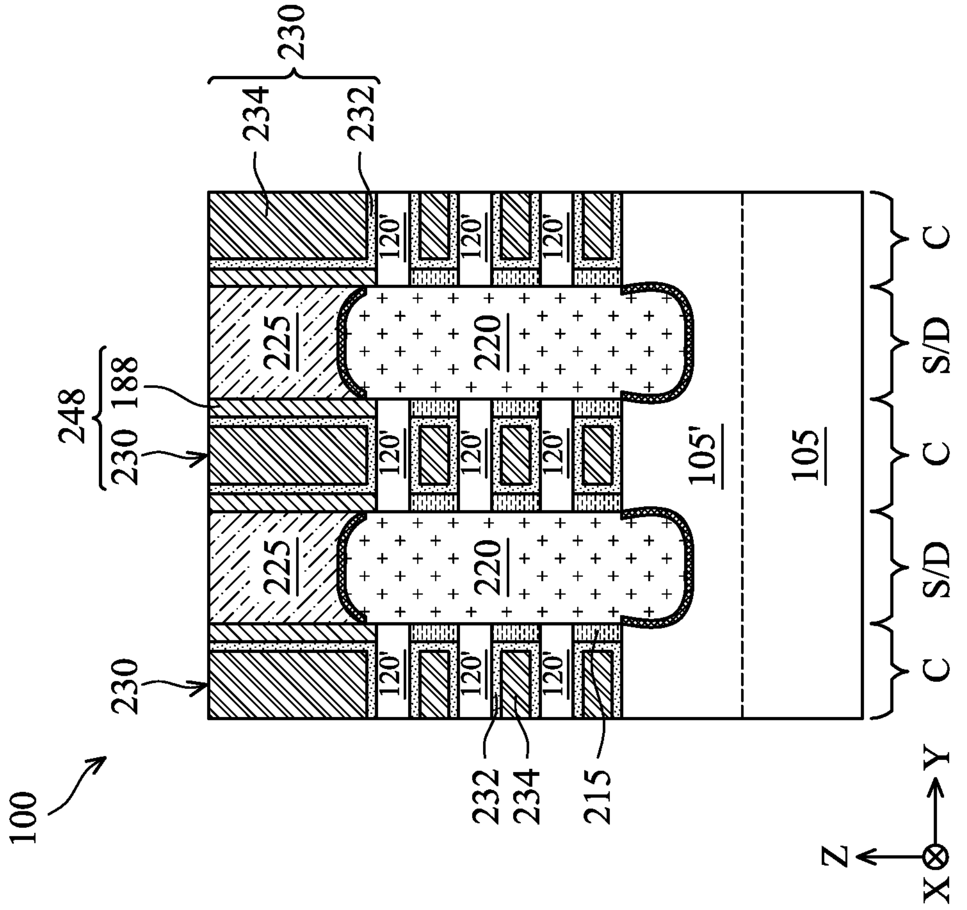
Figure 3G:
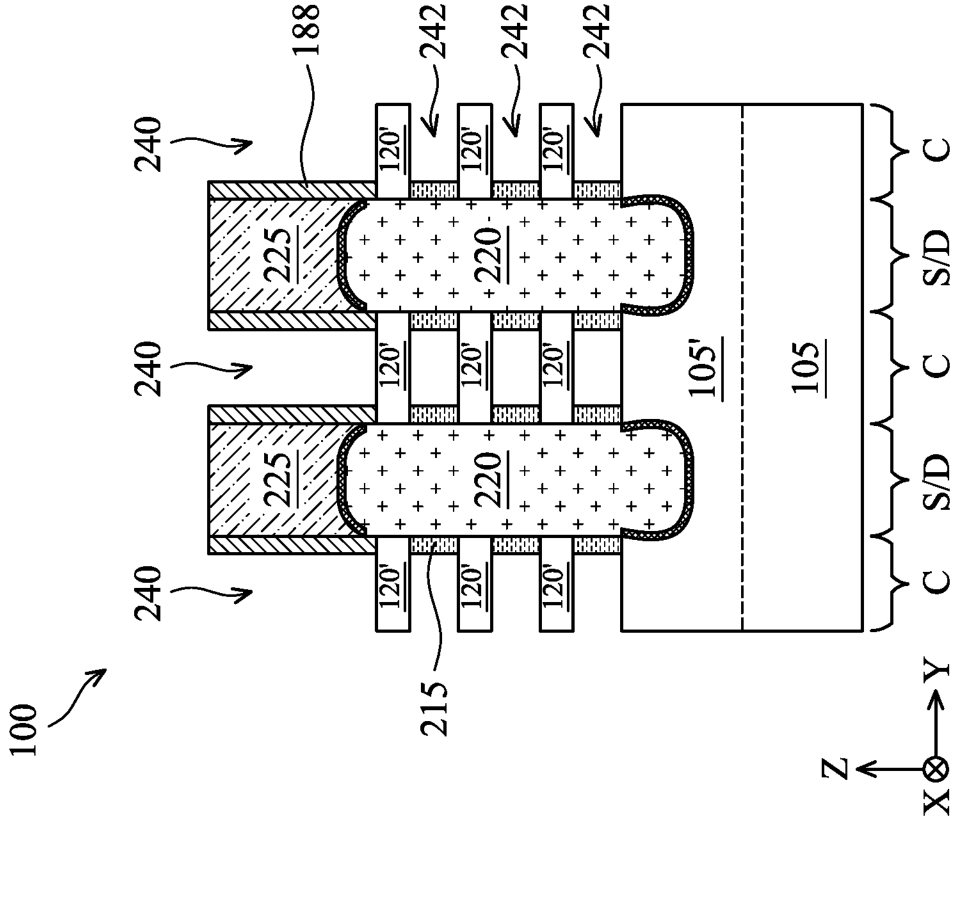
Figure 4C:
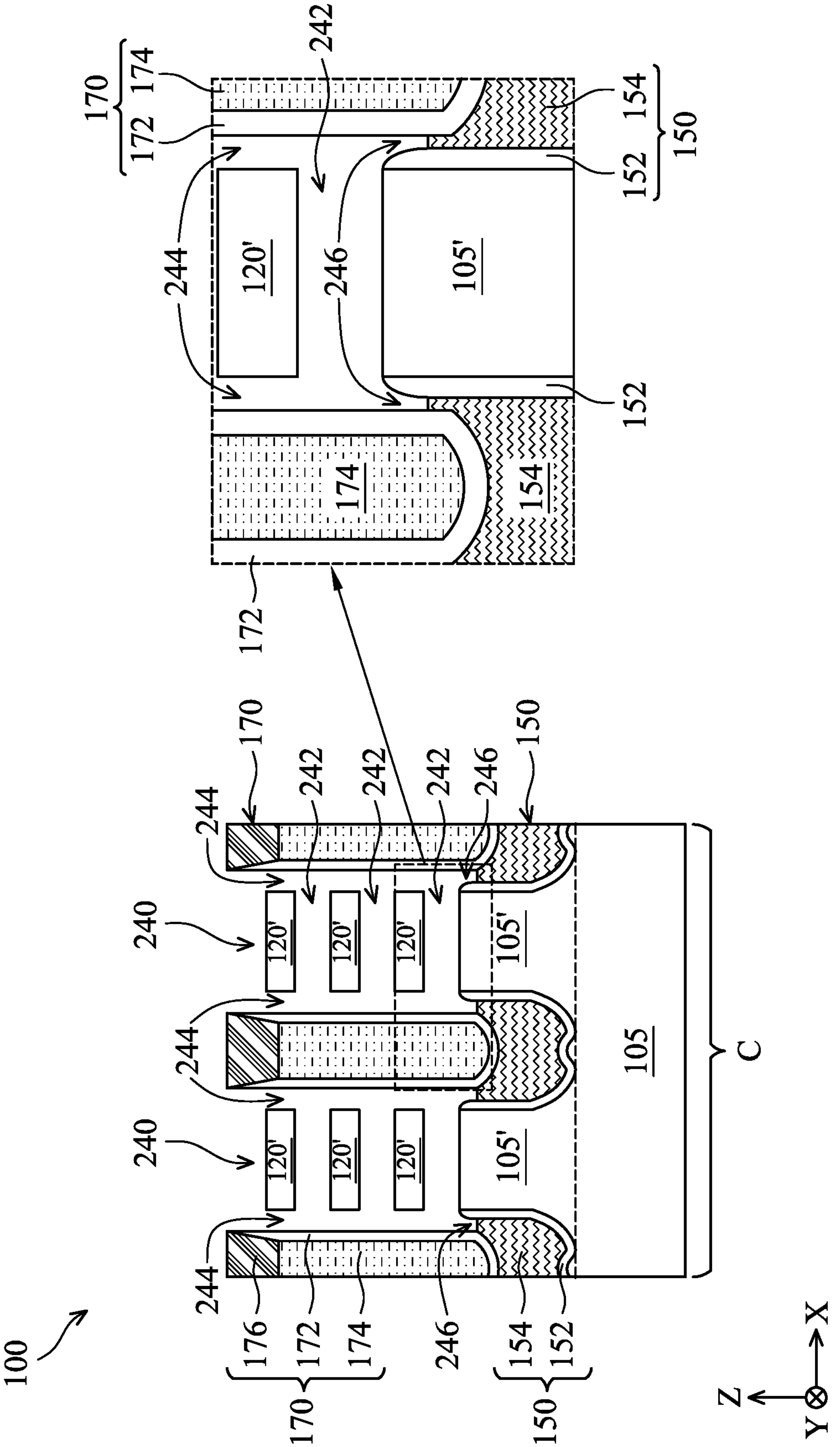

Turning to FIG. 2Q, FIG. 2R, FIG. 3G, FIG. 3H, FIG. 4C, and FIG. 4D, a gate replacement process is performed to replace dummy gate stacks 180 with gate stacks 230, each of which includes a gate dielectric 232 and a gate electrode 234. For example, in FIG. 2Q, FIG. 3G, and FIG. 4C, dummy gate stacks 180 are removed to form gate openings 240 that expose channel regions of fin 130A and fin 130B. Gate openings 240 are between gate spacers 188 in the Y-Z plane (FIG. 3G) and between dielectric fins 170 (e.g., high-k dielectric layers 176 and/or dielectric liners 172) in the X-Z plane (FIG. 4C). In some embodiments, an etching process selectively removes dummy gate stacks 180 with respect to dielectric layer 225, fin spacers 189, gate spacers 188, high-k dielectric layers 176, dielectric liners 172, sacrificial silicon germanium layers 160, semiconductor layers 120, or combinations thereof. In other words, the etching process substantially removes dummy gate stacks 180 but does not remove, or does not substantially remove, dielectric layer 225, fin spacers 189, gate spacers 188, high-k dielectric layers 176, dielectric liners 172, sacrificial silicon germanium layers 160, semiconductor layers 120, or combinations thereof. The etching process is a dry etch, a wet etch, other suitable etching process, or combinations thereof. In some embodiments, the etching process uses a patterned mask layer as an etch mask, where the patterned mask layer covers source/drain regions of multigate device 100 (e.g., dielectric layer 225, fin spacers 189, gate spacers 188, dielectric fins 170, or combinations thereof) but has openings therein that expose channel regions of multigate device 100 (e.g., dummy gate stacks 180).

Before forming gate stacks 230 in gate openings 240, a channel release process is performed to form suspended channel layers. For example, in FIG. 2Q, FIG. 3G, and FIG. 4C, semiconductor layers 115 and sacrificial silicon germanium layers 160 exposed by gate openings 240 are selectively removed to form air gaps 242 and air gaps 244, respectively, thereby suspending semiconductor layers 120 in channel regions of multigate device 100. Gaps 242 are between semiconductor layers 120 and between semiconductor layers 120 and semiconductor mesas 105'. Gaps 244 are between semiconductor layers 120 and dielectric fins 170 and between gaps 242 and dielectric fins 170. In FIG. 4C, because sacrificial silicon germanium layers 160 extend below top surfaces of semiconductor mesas 105' as described above, air gaps 246 form between dielectric fins 170 (e.g., dielectric liners 172) and isolation features 150 (e.g., dielectric liners 152) along the x-direction and isolation features 150 (e.g., oxide layers 154) and between gaps 244 along the z-direction. In the depicted embodiment, each channel region has three suspended semiconductor layers 120, which are referred to hereafter as channel layers 120'. Channel layers 120' are vertically stacked along the z-direction and provide three channels, respectively, through which current can flow between respective epitaxial source/drain features 220 during operation of transistors of multigate device 100.

In some embodiments, an etching process selectively removes semiconductor layers 115 and sacrificial silicon germanium layers 160 with minimal (to no) etching of semiconductor mesas 105', semiconductor layers 120, dielectric fins 170 (in particular, high-k dielectric layers 176 and/or dielectric liners 172), gate spacers 188, fin spacers 189, inner spacers 215, dielectric layer 225, or combinations thereof. In some embodiments, an etchant is selected for the etch process that etches silicon germanium (i.e., semiconductor layers 115 and sacrificial silicon germanium layers 160) at a higher rate than silicon (i.e., semiconductor layers 120 and semiconductor mesas 105') and dielectric materials (i.e., high-k dielectric layers 176, dielectric liners 172, gate spacers 188, fin spacers 189, inner spacers 215, dielectric layer 225, or combinations thereof) (i.e., the etchant has a high etch selectivity with respect to silicon germanium). The etching process is a dry etch, a wet etch, other suitable etching process, or combinations thereof. In some embodiments, before performing the etching process, an oxidation process converts semiconductor layers 115 and sacrificial silicon germanium layers 160 into silicon germanium oxide features, and the etching process then removes the silicon germanium oxide features. In some embodiments, during and/or after removing semiconductor layers 115 and/or sacrificial silicon germanium layers 160, an etching process is performed to modify a profile of semiconductor layers 120 to achieve target dimensions and/or target shapes for channel layers 120'. For example, channel layers 120' can have cylindrical-shaped profiles (e.g., nanowires), rectangular-shaped profiles (e.g., nanobars), sheet-shaped profiles (e.g., nanosheets (e.g., dimensions in the X-Y plane are greater than dimensions in the X-Z plane and the Y-Z plane to form sheet-like structures)), or any other suitable shaped profile. In some embodiments, channel layers 120' have nanometer-sized dimensions and can be referred to as "nanostructures," alone or collectively. In some embodiments, channel layers 120' have sub-nanometer dimensions and/or other suitable dimensions.

Figure 2S:
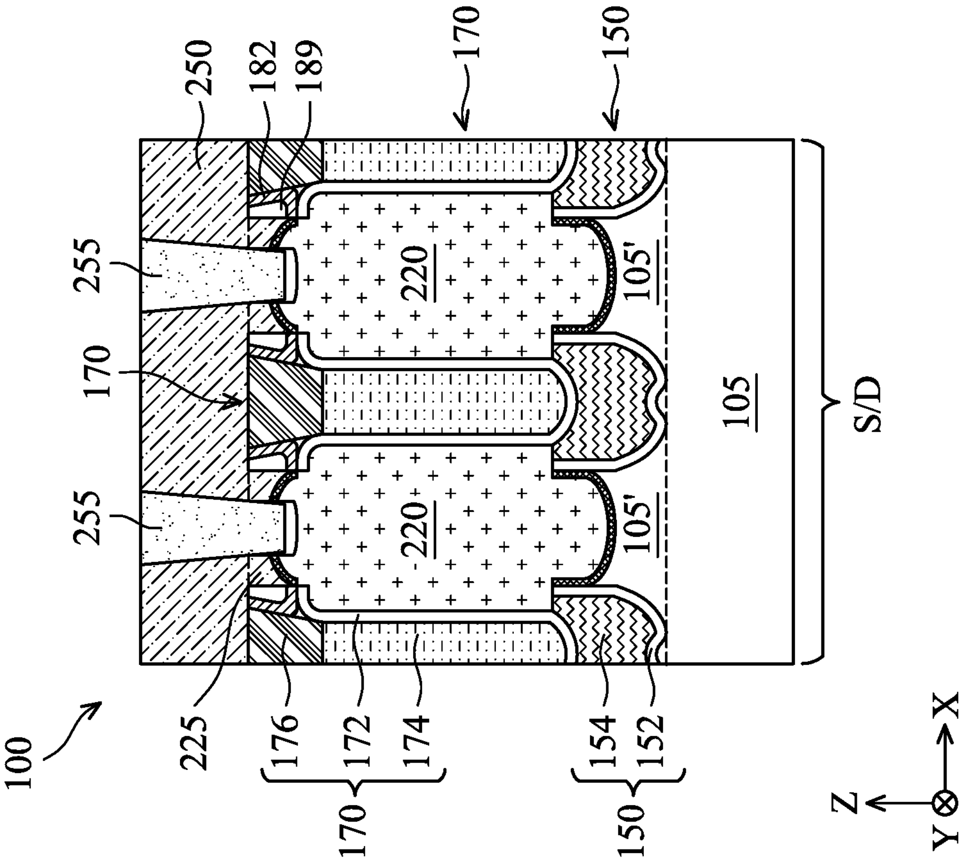
Figure 4D:
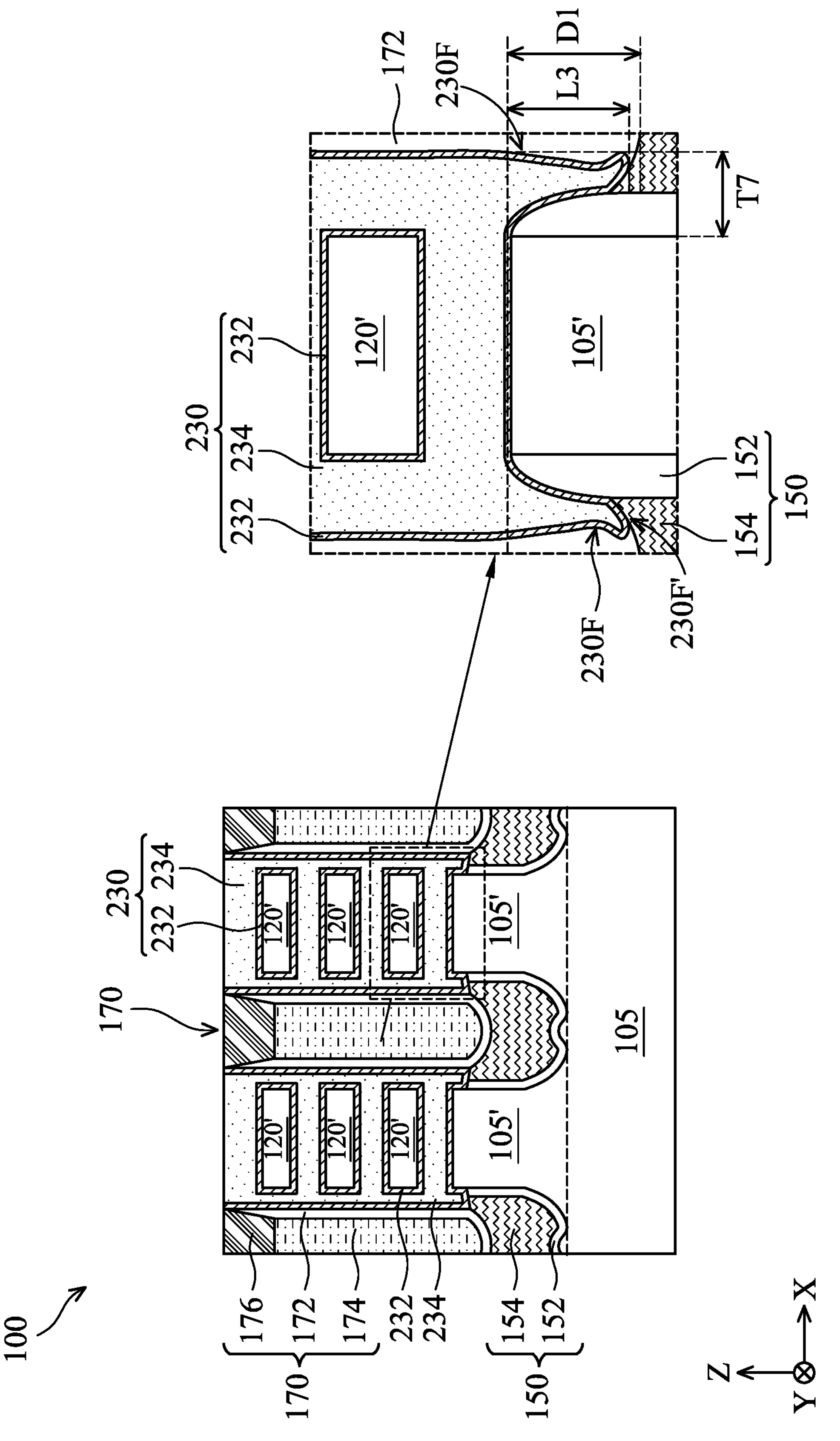

In FIG. 2R, FIG. 3H, and FIG. 4D, processing includes forming gate stacks 230 (also referred to as high-k/metal gates) that fill gate openings 240, gaps 242, gaps 244, and gaps 246. Gate stacks 230 and gate spacers 188 are collectively referred to as gate structures 248. Where multigate device 100 includes at least one GAA transistor, such as the present embodiment, gate stacks 230 surround channel layers 120'. Gate stacks 230 are disposed between channel layers 120' and between channel layers 120' and semiconductor mesas 105'. In the Y-Z plane (FIG. 3H), gate stacks 230 are disposed between respective gate spacers 188 and respective inner spacers 215. In the X-Z plane (FIG. 4D), gate stacks 230 are disposed between channel layers 120' and dielectric liners 172 and/or high-k dielectric layers 176 of dielectric fins 170.

In FIG. 4D, portions of gate stacks 230 that fill gaps 246 form gate feet 230F. Gate feet 230F are below top surfaces of semiconductor mesas 105', between dielectric liners 152 of isolation features 150 and dielectric liners 172 of dielectric fins 170, physically contact dielectric liners 152, physically contact dielectric liners 172, and physically contact oxide layers 154. Elongated sacrificial silicon germanium layers 160, which extend below top surfaces of semiconductor mesas 105', "de-foot" gate stacks 230. De-footing gate stacks 230 minimizes and/or prevents protrusion of gate stacks 230 into the source/drain regions of multigate device 100, which can reduce diffusion of metal from gate stacks 230 into the source/drain regions and/or improve operation of multigate device 100. For example, in contrast to GAA fabrication techniques where sidewall profiles of gate stacks are provided by dummy gate stacks that are formed around a channel region of a semiconductor fin after forming isolation features and before forming dielectric fins, sidewall profiles of gate stacks 230 are provided by dummy gate stacks 200 and sacrificial silicon germanium layers 160. In particular, sidewall profiles of gate stacks 230 and thus widths of gate stacks 230 (here, along the x-direction) from top surfaces of topmost channel layer 120' to top surfaces of semiconductor mesa 105' are provided by sacrificial silicon germanium layers 160, instead of dummy gate stacks. By extending sacrificial silicon germanium layers 160 below top surfaces of semiconductor mesas 105', any gate widening, gate footing (e.g., gate feet 230F), and/or gate sidewall variation is pushed below top surfaces of semiconductor mesas 105', which provides gate stacks 230 with substantially uniform widths from top surfaces of topmost channel layers 120' to top surfaces of semiconductor mesa 105' (i.e., the active regions), instead of having wider bottom portions above top surfaces of semiconductor mesas 105' that can protrude into source/drain regions.

Gate feet 230F have a thickness T7 (here, along the x-direction) and a length L3 (here, along the z-direction). In some embodiments, thickness T7 is about equal to thickness T5 of feet 160F. In the depicted embodiment, the etching process that removes sacrificial silicon germanium layers 160 also removes dielectric liners 172 but at a significantly lower etch rate than sacrificial silicon germanium layers 160, thereby providing gaps 244 and/or gaps 246 with widths along the x-direction that are greater than thickness T4 and thickness t5, respectively. In such embodiments, thickness T7 is greater than thickness T5. In some embodiments, thickness T7 is about 5 nm to about 20 nm. In some embodiments, removing dielectric liners 272 may also result in exposing a larger portion of oxide layers 154 than covered by feet 160F, thereby extending gaps 246 further below top surfaces of semiconductor mesas 105' than sacrificial silicon germanium layers 160. In such embodiments, gate stacks 230 will extend further below top surfaces of semiconductor mesas 105' than sacrificial silicon germanium layers 160, and length L3 is greater than length L2. In some embodiments, length L3 is about 3.5 nm to about 22.6 nm. In some embodiments, the etching process that removes sacrificial silicon germanium layers 160 also removes dielectric liners 152 and/or oxide layers 154 but at a significantly lower etch rate than sacrificial silicon germanium layers 160, which can also increase widths of gaps 244 and/or widths gaps 246 and thus also increase thickness T7 relative to thickness T5 and/or length L3 relative to length L2. With gate feet 230F, gate stacks 230 wrap top portions of semiconductor mesas 105' and physically contact top surfaces of semiconductor mesas 105'. In the depicted embodiment, dielectric liners 152 are between gate stacks 230 and sidewalls of the top portions of semiconductor mesas 105'. In some embodiments, the etching process that removes sacrificial silicon germanium layers 160 may completely remove liner portions 152A from the sidewalls of the top portions of semiconductor mesas 105'. In such embodiments, gate stacks 230 physically contact the sidewalls of the top portions of semiconductor mesas 105' where liner portions 152A are completely removed by the etching process.

Gate feet 230F may also have bottom portions 230F', which are similar to bottom portions 160F' of feet 160F. For example, bottom portions 230F' are portions of gate feet 230F that extend beyond liner portions 152 along top surfaces of oxide layers 154. Bottom portions 230F' are between oxide layer 154 of isolation features 150 and dielectric liners 172 of dielectric fins 170. Bottom portions 230F' have a thickness, a necking angle, and a footing angle that is similar to thickness T6, necking angle θ, and footing angle φ, respectively, of bottom portions 160F'. In some embodiments, the thickness, the necking angle, and/or the footing angle of bottom portions 230F' is greater than thickness T6, necking angle θ, and footing angle φ, respectively, of bottom portions 160F' as a result of removal of dielectric liners 172, dielectric liners 152, and/or oxide layers 154 when removing sacrificial silicon germanium layers 160.

Gate stacks 230 are configured to achieve desired functionality according to design requirements of multigate device 100, and gate stacks 230 may include the same or different layers and/or materials. As noted, gate stacks 230 include a respective gate dielectric 232, each of which can include a gate dielectric layer, and a respective gate electrode 234, each of which can include a work function layer and a bulk (or fill) conductive layer. Gate stacks 230 may include numerous other layers, for example, capping layers, interface layers, diffusion layers, barrier layers, hard mask layers, or combinations thereof. In some embodiments, gate dielectrics 232 include a gate dielectric layer disposed over an interfacial layer (including a dielectric material, such as silicon oxide), and gate electrodes 234 are disposed over gate dielectrics 232. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the gate dielectric layer is a high-k dielectric layer. Gate electrodes 234 include a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the conductive bulk layer is a conductive layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, $ZrSi_2$, $MoSi_2$, $TaSi_2$, $NiSi_2$, WN, other suitable p-type work function materials, or combinations thereof. The bulk conductive layer includes a suitable conductive material, such as Al, W, Cu, Ti, Ta, polysilicon, metal alloys, other suitable materials, or combinations thereof. In some embodiments, forming gate stacks 230 includes depositing a gate dielectric layer over multigate device 100 that partially fills gate openings (e.g., gate openings 240, gaps 242, gaps 244, and gaps 246), depositing a gate electrode layer over the gate dielectric layer that fills remainders of the gate openings, and performing a planarization process, such as CMP, on the gate electrode layer and/or the gate dielectric layer. The deposition processes can include CVD, PVD, ALD, RPCVD, PECVD, HDPCVD, FCVD, HARP, LPCVD, ALCVD, APCVD, SACVD, MOCVD, plating, other suitable methods, or combinations thereof.

Figure 3I:
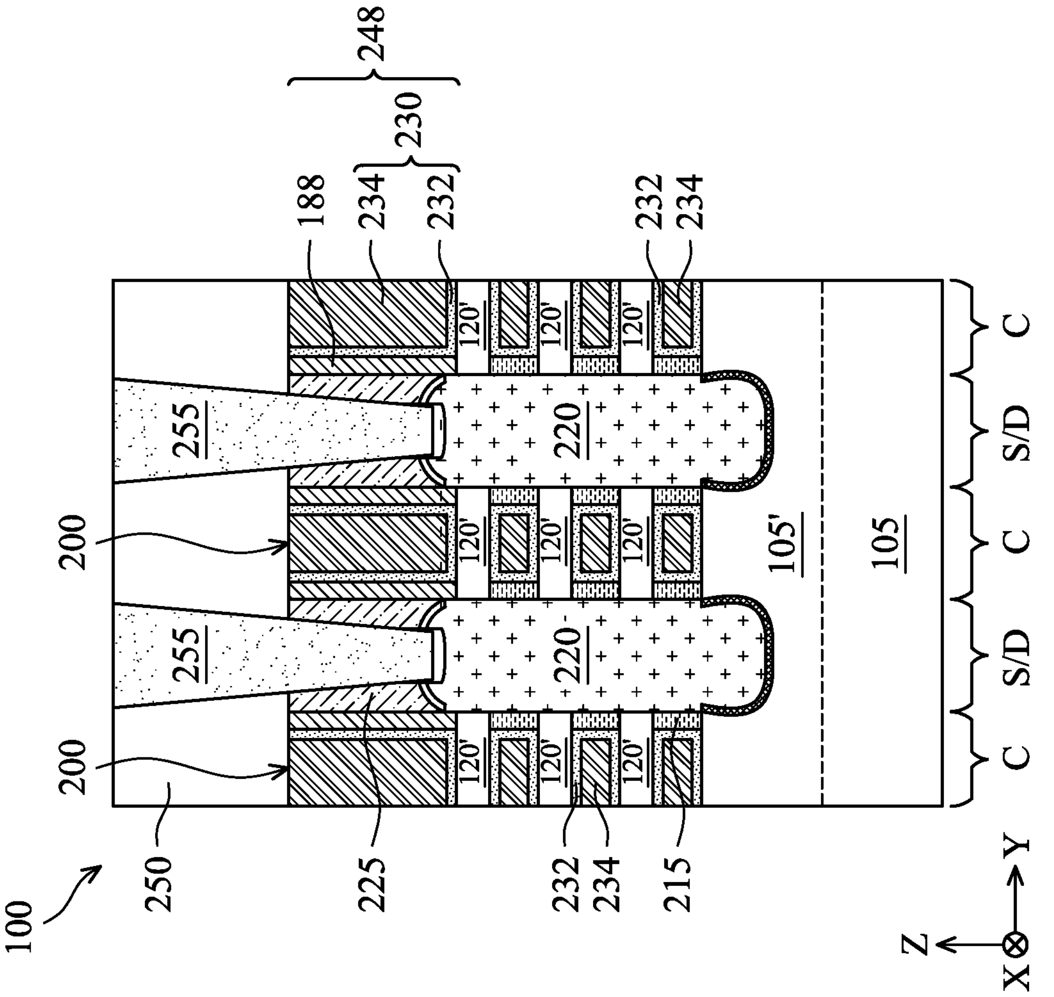

Turning to FIG. 2S and FIG. 3I, processing can include forming device-level contacts, such as metal-to-poly (MP) contacts, which generally refer to contacts to gate stacks 230, and metal-to-device (MD) contacts, which generally refer to contacts to an electrically active region of multigate device 100, such as epitaxial source/drain features 220. Device-level contacts electrically and physically connect IC device features to metallization layers of a multilayer interconnect (MLI) feature described further below. In some embodiments, a dielectric layer 250, which is similar to dielectric layer 225, is formed over multigate device 100, and source/drain contacts 255 are formed in dielectric layer 250 and dielectric layer 225. In some embodiments, source/drain contacts 255 are formed by performing a lithography and etching process, such as described herein, to form contact openings that extend through dielectric layer 250 and dielectric layer 225 and expose epitaxial source/drain features 220; performing a first deposition process to form a contact barrier material over dielectric layer 250 and dielectric layer 225 that partially fills the contact openings; and performing a second deposition process to form a contact bulk material over the contact barrier material, where the contact bulk material fills remainders of the contact openings. In such embodiments, the contact barrier material and the contact bulk material are disposed in the contact openings and over a top surface of dielectric layer 250. The first deposition process and the second deposition process may be CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, silicide layers are formed over epitaxial source/drain features 220 before forming the contact barrier material (e.g., by depositing a metal layer over epitaxial source/drain features 220 and heating multigate device 100 to cause constituents of epitaxial source/drain features 220 to react with metal constituents of the metal layer). In some embodiments, the silicide layers include a metal constituent (e.g., nickel, platinum, palladium, vanadium, titanium, cobalt, tantalum, ytterbium, zirconium, other suitable metal, or combinations thereof) and a constituent of epitaxial source/drain features 220 (e.g., silicon and/or germanium). In some embodiments, source/drain contacts 255 include tungsten and/or cobalt, and the silicide layers include titanium and silicon. In such embodiments, titanium silicide layers can reduce resistance between epitaxial source/drain features 220 and source/drain contacts 255, such as those that include tungsten plugs and/or cobalt plugs. A CMP process and/or other planarization process is performed to remove excess contact bulk material and contact barrier material, for example, from over a top surface of dielectric layer 250, resulting in source/drain contacts 255 (i.e., the contact barrier layer and the contact bulk layer filling the contact openings). The CMP process planarizes top surfaces of source/drain contact 255, such that a top surface of dielectric layer 250 and top surfaces of source/drain contacts 255 form a substantially planar surface.

Dielectric layer 225, dielectric layer 250, MD contacts (e.g., source/drain contacts 255), and MP contacts (e.g., contacts to one or more of gate stacks 230) are a portion of an MLI feature. The MLI feature electrically couples various devices (for example, p-type transistors and/or n-type transistors of multigate device 100, resistors, capacitors, and/or inductors) and/or components (for example, gate electrodes and/or epitaxial source/drain features) of p-type transistors and/or n-type transistors of multigate device 100, such that the various devices and/or components can operate as specified by design requirements of multigate device 100. The MLI feature includes a combination of dielectric layers and electrically conductive layers (e.g., metal layers) that combine to form various interconnect structures. For example, the conductive layers form vertical interconnect features, such as device-level contacts and/or vias, and/or horizontal interconnect features, such as conductive lines. Vertical interconnect features typically connect horizontal interconnect features in different levels (or different layers) of the MLI feature. During operation, the interconnect features route signals between the devices and/or the components of multigate device 100 and/or distribute signals (for example, clock signals, voltage signals, and/or ground signals) to the devices and/or the components of multigate device 100.

In some embodiments, dielectric layer 225 is a bottommost layer of the MLI feature (e.g., dielectric layer 225 is ILD0 and dielectric layer 250 is ILD1). Processing can continue with forming additional features of the MLI feature, such as metallization layers (levels) of the MLI feature, such as a first metallization layer (i.e., a metal one (M1) layer and a via zero (VO) layer), a second metallization layer (i.e., a metal two (M2) layer and a via one (V1) layer) . . . to a topmost metallization layer (i.e., a metal X (MX) layer and a via Y (VY) layer, where X is a total number of patterned metal line layers of the MLI feature and Y is a total number of patterned via layers of the MLI feature) over the first metallization layer. Each of the metallization layers includes a patterned metal line layer and a patterned via layer configured to provide at least one interconnect structure disposed in an insulator layer. The patterned metal line layer and the patterned metal via layer are formed by any suitable process, including by various dual damascene processes, and include any suitable materials and/or layers.

Figure 5:
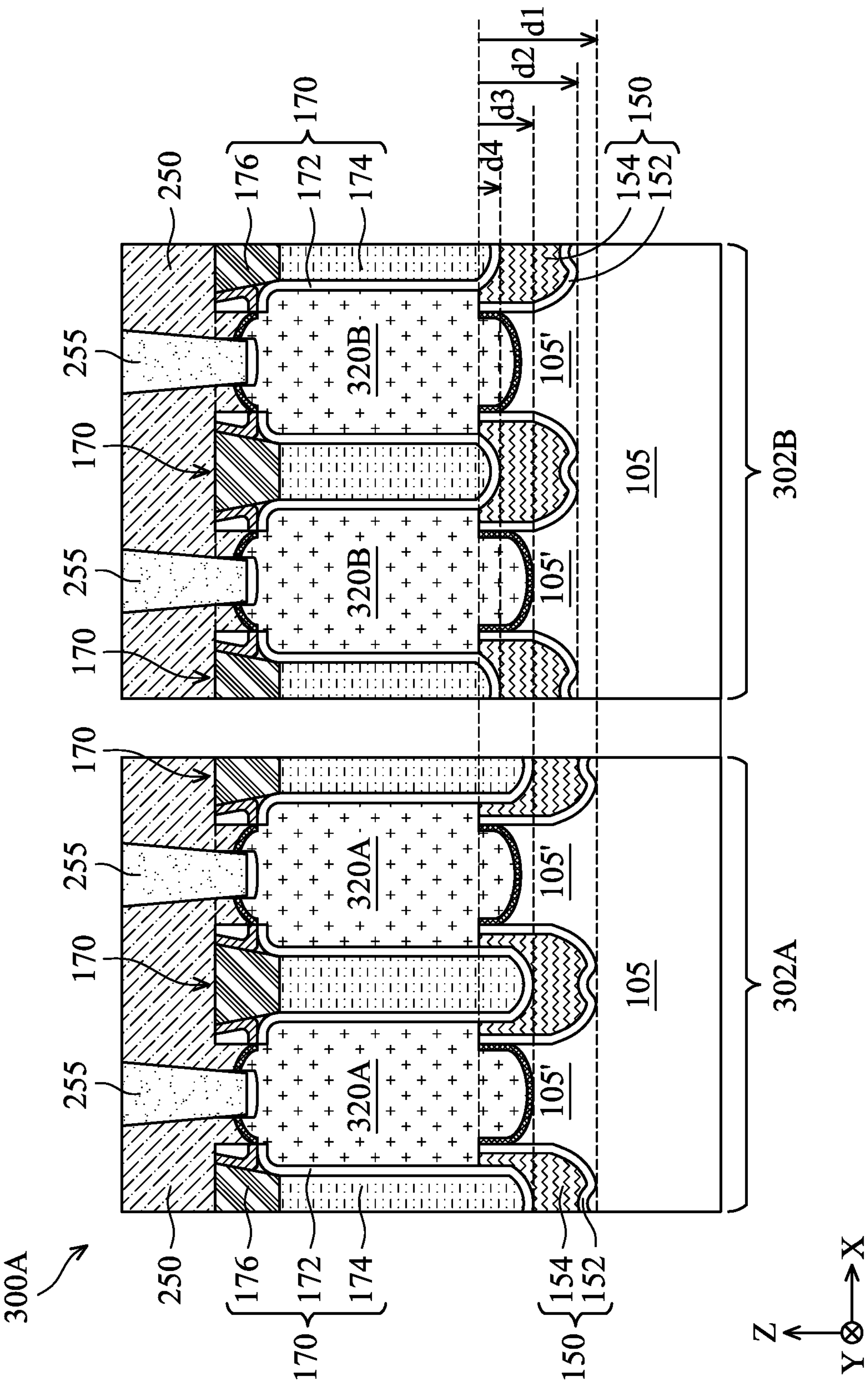
FIG. 5 is a fragmentary cross-sectional view of a multigate device having different transistor regions, in portion or entirety, according to various aspects of the present disclosure.
Figure 6:
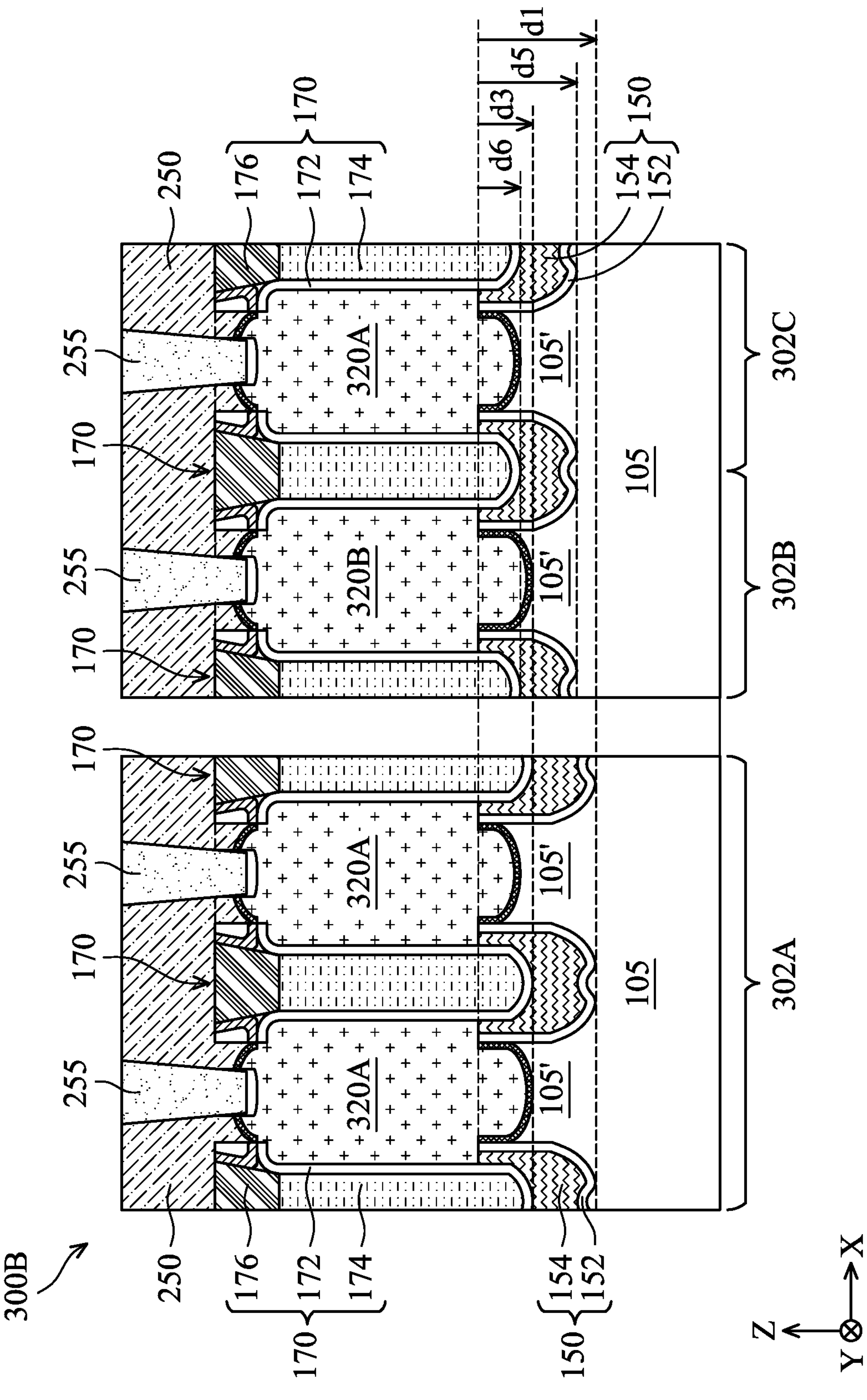
FIG. 6 is a fragmentary cross-sectional view of a multigate device having different transistor regions, in portion or entirety, according to various aspects of the present disclosure.

Depths of isolation structures, such as isolation features 150 and dielectric fins 170, may depend on types of active regions between which the isolation structures are interposed. FIG. 5 and FIG. 6 are fragmentary cross-sectional views of a multigate device 300A and a multigate device 300B, respectively, in portion or entirety, according to various aspects of the present disclosure. For clarity and simplicity, similar features of multigate device 100 in FIGS. 2A-2S, FIGS. 3A-3I, and FIGS. 4A-4D, multigate device 300A in FIG. 5, and multigate device 300B in FIG. 6 are identified by the same reference numerals. Multigate device 300A and multigate device 300B are similar in many respects to multigate device 100. Multigate device 300A and/or multigate device 300B may be included in a microprocessor, a memory, other IC device, or combinations thereof. In some embodiments, multigate device 300A and/or multigate device 300B is a portion of an IC chip, an SoC, or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 5 and FIG. 6 have been simplified for the sake of clarity to better understand the inventive concepts of the present disclosure. Additional features can be added in multigate device 300A and/or multigate device 300B, and some of the features described below can be replaced, modified, or eliminated in other embodiments of multigate device 300A and/or multigate device 300B.

In FIG. 5, multigate device 300A includes a p-type transistor region 302A configured with p-type transistors having p-type epitaxial source/drain features 320A and an n-type transistor region 302B configured with n-type transistors having n-type epitaxial source/drain features 320B. Depths of isolation structures between active regions in p-type transistor regions (e.g., PP regions) are deeper than depths of isolation structures between active regions in n-type transistor regions (e.g., NN regions). For example, isolation features 150 between p-type epitaxial source/drain features 320A have depth d1, isolation features 150 between n-type epitaxial source/drain features 320B have depth d2, dielectric fins 170 between p-type epitaxial source/drain features 320A have depth d3, and dielectric fins 170 between n-type epitaxial source/drain features 320B have depth d4. Depth d1 and depth d2 are between top surfaces of semiconductor mesas 105' and bottom surfaces of respective isolation features 150, and depth d3 and depth d4 are between top surfaces of semiconductor mesas 105' and bottom surfaces of dielectric fins 170. Depth d1 in the PP region is greater than depth d2 in the NN region, and depth d3 in the PP region is greater than depth d4 in the NN region.

In FIG. 6, multigate device 300B includes p-type transistor region 302A, n-type transistor region 302B, and a p-type transistor region 302C configured with p-type transistors having p-type epitaxial source/drain features 320A. Depths of isolation structures between active regions in p-type transistor regions (e.g., PP regions) are deeper than depths of isolation structures between active regions in different type transistor regions (e.g., NP regions). For example, isolation features 150 between p-type epitaxial source/drain features 320A have depth d1, isolation features 150 between n-type epitaxial source/drain features 320B and p-type epitaxial source/drain features 320A have depth d5, dielectric fins 170 between p-type epitaxial source/drain features 320A have depth d3, and dielectric fins 170 between n-type epitaxial source/drain features 320B and p-type epitaxial source/drain features 320A have depth d6. Depth d5 is between top surfaces of semiconductor mesas 105' and bottom surfaces of respective isolation features 150, and depth d6 is between top surfaces of semiconductor mesas 105' and bottom surfaces of dielectric fins 170. Depth d1 in the PP region is greater than depth d5 in the NP region, and depth d3 in the PP region is greater than depth d6 in the NP region.

Fabrication techniques for enhancing performance and/or reliability of multigate devices, such as gate-all-around (GAA) FETs, are disclosed herein. The present disclosure provides for many different embodiments. An exemplary method includes forming a semiconductor fin having a semiconductor layer stack over a semiconductor mesa. The semiconductor layer stack includes a first semiconductor layer and a second semiconductor layer. The first semiconductor layer is between the semiconductor mesa and the second semiconductor layer. The method further includes forming an isolation feature adjacent the semiconductor mesa and forming a semiconductor cladding layer along a sidewall of the semiconductor layer stack. The semiconductor cladding layer extends below a top surface of the semiconductor mesa and a portion of the isolation feature is between the semiconductor cladding layer and a sidewall of the semiconductor mesa. The method further includes, in a channel region, replacing the first semiconductor layer of the semiconductor fin and the semiconductor cladding layer with a gate stack. The portion of the isolation feature is between the gate stack and the sidewall of the semiconductor mesa.

In some embodiments, the method further includes forming a dielectric fin over the isolation feature after forming the semiconductor cladding layer and before replacing the first semiconductor layer of the semiconductor fin and the semiconductor cladding layer with the gate stack. In such embodiments, replacing the first semiconductor layer of the semiconductor fin and the semiconductor cladding layer can include performing an etching process having a first etch rate for the first semiconductor layer and the semiconductor cladding layer, a second etch rate for the second semiconductor layer, and a third etch rate for the dielectric fin. The first etch rate is greater than the second etch rate, the first etch rate is greater than the third etch rate, and the third etch rate is greater than the second etch rate. In some embodiments, the method further includes forming a dummy gate stack over the semiconductor fin. The dummy gate stack wraps a top portion of the dielectric fin. In such embodiments, replacing the first semiconductor layer of the semiconductor fin and the semiconductor cladding layer with the gate stack can includes forming a gate opening by removing the dummy gate stack to expose a top surface of the semiconductor fin and performing the etching process after forming the gate opening. A first gap is between the second semiconductor layer and the dielectric fin, a second gap is between the second semiconductor layer and the semiconductor mesa, and a third gap is between the dielectric fin and the portion of the isolation feature after performing the etching process. In such embodiments, replacing the first semiconductor layer of the semiconductor fin and the semiconductor cladding layer with the gate stack can further include filling the gate opening, the first gap, the second gap, and the third gap with a gate dielectric and a gate electrode.

In some embodiments, the method further includes, in a source/drain region, replacing the first semiconductor layer of the semiconductor fin, the second semiconductor layer of the semiconductor fin, and the semiconductor cladding layer with an epitaxial source/drain feature over the semiconductor mesa. The epitaxial source/drain feature extends over a top surface of the isolation feature. In some embodiments, forming the isolation feature includes recessing a top surface of the isolation feature to expose the portion of the isolation feature. In some embodiments, forming the isolation feature includes depositing a dielectric liner in a trench adjacent the semiconductor fin, depositing a dielectric layer in the trench over the dielectric liner, planarizing the dielectric layer and the dielectric liner, and etching back the dielectric layer and the dielectric liner until a top surface of the dielectric layer is lower than a top surface of the semiconductor mesa. In such embodiments, the portion of the isolation feature is a portion of the dielectric liner. In some embodiments, the etching back rounds an exposed surface of the portion of the dielectric liner. In some embodiments, the isolation feature includes a bulk dielectric disposed over a dielectric liner, the dielectric liner is between the semiconductor mesa and the bulk dielectric, the gate stack wraps the semiconductor mesa, and the portion of the isolation feature between the gate stack and the sidewall of the semiconductor mesa is the dielectric liner.

Another exemplary method includes forming a fin structure extending from a substrate. The fin structure includes a semiconductor layer stack over a substrate extension and the semiconductor layer stack includes first semiconductor layers and second semiconductor layers. The method further includes forming an isolation feature adjacent the fin structure. The isolation feature has a dielectric layer disposed over a dielectric liner. The method further includes etching back the isolation feature and exposing a portion of the dielectric liner of the isolation feature that is along a sidewall of the substrate extension and forming a sacrificial semiconductor layer along a sidewall of the semiconductor layer stack. The sacrificial semiconductor layer extends below a top surface of the substrate extension to the dielectric layer of the isolation feature and the sacrificial semiconductor layer covers the portion of the dielectric liner of the isolation feature. The method further includes forming a dielectric fin over the isolation feature. The sacrificial semiconductor layer is between the dielectric fin and the semiconductor layer stack and the sacrificial semiconductor layer is between the dielectric fin and the isolation feature. The method further includes removing the sacrificial semiconductor layer and the first semiconductor layers and forming a metal gate stack around the second semiconductor layers. In some embodiments, forming the sacrificial semiconductor layer along the sidewall of the semiconductor layer stack includes depositing a semiconductor layer over the fin structure and the isolation feature and removing the semiconductor layer from a top surface of the semiconductor layer stack and a top surface of the isolation feature. In some embodiments, removing the sacrificial semiconductor layer and the first semiconductor layers partially removes the dielectric fin.

In some embodiments, a length of the metal gate stack below the top surface of the substrate extension is greater than a length of the sacrificial semiconductor layer below the top surface of the substrate extension. In some embodiments, a width of the metal gate stack between sidewalls of the second semiconductor layers and the dielectric fin is greater than a width of the sacrificial semiconductor layer between the sidewall of the semiconductor layer stack and the dielectric fin. In some embodiments, the method further includes removing the sacrificial semiconductor layer and the first semiconductor layers from a channel region and forming the metal gate stack around the second semiconductor layers in the channel region. In some embodiments, the method further includes forming an epitaxial source/drain in a source/drain region. In some embodiments, the epitaxial source/drain is formed by removing the first semiconductor layers and the second semiconductor layers from the source/drain region to form a source/drain recess, removing the sacrificial semiconductor layer from the source/drain region to laterally extend the source/drain recess, and forming an epitaxial layer in the source/drain recess. In some embodiments, the method further includes forming a dummy gate stack over the semiconductor layer stack after forming the dielectric fin and removing the dummy gate stack after forming the epitaxial source/drain to expose the sacrificial semiconductor layer and the semiconductor layer stack.

An exemplary semiconductor structure includes a semiconductor mesa, an isolation feature adjacent to the semiconductor mesa, a dielectric fin disposed over the isolation feature, a semiconductor layer disposed over the semiconductor mesa, and a gate stack that surrounds the semiconductor layer. A portion of the gate stack extends below a top surface of the semiconductor mesa and the portion of the gate stack is between the isolation feature and the dielectric fin. In some embodiments, the isolation feature includes an oxide layer disposed over a dielectric liner and the portion of the gate stack physically contacts the oxide layer, the dielectric liner, and the dielectric fin. In some embodiments, a bottom surface of the dielectric fin is lower than the top surface of the semiconductor mesa. In some embodiments, the semiconductor structure further includes an epitaxial source/drain feature disposed over the semiconductor mesa and adjacent to the semiconductor layer. The epitaxial source/drain feature extends over a top surface of the isolation feature and physically contacts the dielectric fin. In some embodiments, the isolation feature includes an oxide layer disposed over a dielectric liner and the epitaxial source/drain feature physically contacts the oxide layer and the dielectric liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a semiconductor fin having a semiconductor layer stack over a semiconductor mesa, wherein the semiconductor layer stack includes a first semiconductor layer and a second semiconductor layer, and wherein the first semiconductor layer is between the semiconductor mesa and the second semiconductor layer;

forming an isolation feature adjacent the semiconductor mesa;

forming a semiconductor cladding layer along a sidewall of the semiconductor layer stack, wherein the semiconductor cladding layer extends below a top surface of the semiconductor mesa and a portion of the isolation feature is between the semiconductor cladding layer and a sidewall of the semiconductor mesa; and in a channel region, replacing the first semiconductor layer of the semiconductor fin and the semiconductor cladding layer with a gate stack, wherein the portion of the isolation feature is between the gate stack and the sidewall of the semiconductor mesa.

2. The method of claim 1, further comprising, in a source/drain region, replacing the first semiconductor layer of the semiconductor fin, the second semiconductor layer of the semiconductor fin, and the semiconductor cladding layer with an epitaxial source/drain feature over the semiconductor mesa, wherein the epitaxial source/drain feature extends over a top surface of the isolation feature.

3. The method of claim 1, further comprising:

forming a dielectric fin over the isolation feature after forming the semiconductor cladding layer and before replacing the first semiconductor layer of the semiconductor fin and the semiconductor cladding layer with the gate stack; and wherein the replacing the first semiconductor layer of the semiconductor fin and the semiconductor cladding layer includes performing an etching process having a first etch rate for the first semiconductor layer and the semiconductor cladding layer, a second etch rate for the second semiconductor layer, and a third etch rate for the dielectric fin, wherein the first etch rate is greater than the second etch rate, the first etch rate is greater than the third etch rate, and the third etch rate is greater than the second etch rate.

4. The method of claim 3, further comprising:

forming a dummy gate stack over the semiconductor fin, wherein the dummy gate stack wraps a top portion of the dielectric fin; and wherein the replacing the first semiconductor layer of the semiconductor fin and the semiconductor cladding layer with the gate stack includes:

forming a gate opening by removing the dummy gate stack to expose a top surface of the semiconductor fin, performing the etching process after forming the gate opening, wherein a first gap is between the second semiconductor layer and the dielectric fin, a second gap is between the second semiconductor layer and the semiconductor mesa, and a third gap is between the dielectric fin and the portion of the isolation feature after performing the etching process, and filling the gate opening, the first gap, the second gap, and the third gap with a gate dielectric and a gate electrode.

5. The method of claim 1, wherein the forming the isolation feature includes recessing a top surface of the isolation feature to expose the portion of the isolation feature.

6. The method of claim 1, wherein the forming the isolation feature includes:

depositing a dielectric liner in a trench adjacent the semiconductor fin;

depositing a dielectric layer in the trench over the dielectric liner;

planarizing the dielectric layer and the dielectric liner; and etching back the dielectric layer and the dielectric liner until a top surface of the dielectric layer is lower than a top surface of the semiconductor mesa, wherein the portion of the isolation feature is a portion of the dielectric liner.

7. The method of claim 6, wherein the etching back rounds an exposed surface of the portion of the dielectric liner.

8. The method of claim 1, wherein the isolation feature includes a bulk dielectric disposed over a dielectric liner, the dielectric liner is between the semiconductor mesa and the bulk dielectric, the gate stack wraps the semiconductor mesa, and the portion of the isolation feature between the gate stack and the sidewall of the semiconductor mesa is the dielectric liner.

9. A method comprising:

forming a fin structure extending from a substrate, wherein the fin structure includes a semiconductor layer stack over a substrate extension and the semiconductor layer stack includes first semiconductor layers and second semiconductor layers;

forming an isolation feature adjacent the fin structure, wherein the isolation feature has a dielectric layer disposed over a dielectric liner;

etching back the isolation feature and exposing a portion of the dielectric liner of the isolation feature that is along a sidewall of the substrate extension;

forming a sacrificial semiconductor layer along a sidewall of the semiconductor layer stack, wherein the sacrificial semiconductor layer extends below a top surface of the substrate extension to the dielectric layer of the isolation feature and the sacrificial semiconductor layer covers the portion of the dielectric liner of the isolation feature;

forming a dielectric fin over the isolation feature, wherein the sacrificial semiconductor layer is between the dielectric fin and the semiconductor layer stack and the sacrificial semiconductor layer is between the dielectric fin and the isolation feature;

removing the sacrificial semiconductor layer and the first semiconductor layers; and forming a metal gate stack around the second semiconductor layers.

10. The method of claim 9, wherein forming the sacrificial semiconductor layer along the sidewall of the semiconductor layer stack includes:

depositing a semiconductor layer over the fin structure and the isolation feature; and removing the semiconductor layer from a top surface of the semiconductor layer stack and a top surface of the isolation feature.

11. The method of claim 9, wherein the removing the sacrificial semiconductor layer and the first semiconductor layers partially removes the dielectric fin.

12. The method of claim 9, wherein a length of the metal gate stack below the top surface of the substrate extension is greater than a length of the sacrificial semiconductor layer below the top surface of the substrate extension.

13. The method of claim 9, wherein a width of the metal gate stack between sidewalls of the second semiconductor layers and the dielectric fin is greater than a width of the sacrificial semiconductor layer between the sidewall of the semiconductor layer stack and the dielectric fin.

14. The method of claim 9, further comprising:

removing the sacrificial semiconductor layer and the first semiconductor layers from a channel region and forming the metal gate stack around the second semiconductor layers in the channel region; and forming an epitaxial source/drain in a source/drain region, wherein the forming the epitaxial source/drain includes:

removing the first semiconductor layers and the second semiconductor layers from the source/drain region to form a source/drain recess, removing the sacrificial semiconductor layer from the source/drain region to laterally extend the source/drain recess, and forming an epitaxial layer in the source/drain recess.

15. The method of claim 14, further comprising:

forming a dummy gate stack over the semiconductor layer stack in the channel region after forming the dielectric fin; and removing the dummy gate stack after forming the epitaxial source/drain to expose the sacrificial semiconductor layer and the semiconductor layer stack in the channel region.

16. A method comprising:

forming an isolation feature adjacent to a semiconductor protrusion;

forming a semiconductor layer over the semiconductor protrusion;

forming a dielectric fin over the isolation feature; and forming a gate stack that surrounds the semiconductor layer, wherein a portion of the gate stack extends below a top surface of the semiconductor protrusion, the portion of the gate stack is between the isolation feature and the dielectric fin, and the isolation feature is between the portion of the gate stack and a sidewall of the semiconductor protrusion.

17. The method of claim 16, wherein the forming the isolation feature includes forming an oxide layer over a dielectric liner, wherein the portion of the gate stack abuts the oxide layer, the dielectric liner, and the dielectric fin.

18. The method of claim 16, wherein a bottom surface of the dielectric fin is lower than the top surface of the semiconductor protrusion.

19. The method of claim 16, further comprising forming an epitaxial source/drain feature over the semiconductor protrusion, wherein the epitaxial source/drain feature is adjacent to the semiconductor layer, and further wherein the epitaxial source/drain feature extends over a top surface of the isolation feature and abuts the dielectric fin.

20. The method of claim 19, wherein:

the forming the isolation feature includes forming an oxide layer and a dielectric liner, wherein the oxide layer is over the dielectric liner; and the method further includes forming the epitaxial source/drain feature after the isolation feature, wherein the epitaxial source/drain feature abuts the oxide layer and the dielectric liner.

* * * * *